United States Patent
Kaneko

(10) Patent No.: US 9,547,237 B2
(45) Date of Patent: Jan. 17, 2017

(54) COLORED PHOTO-SENSITIVE COMPOSITION, COLOR FILTER, AND METHOD FOR MANUFACTURING COLOR FILTER

(71) Applicant: FUJIFILM CORPORATION, Tokyo (JP)

(72) Inventor: Yuushi Kaneko, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/819,686

(22) Filed: Aug. 6, 2015

(65) Prior Publication Data

US 2015/0338733 A1    Nov. 26, 2015

Related U.S. Application Data

(63) Continuation of application No. PCT/JP2014/055556, filed on Mar. 5, 2014.

(30) Foreign Application Priority Data

Mar. 5, 2013  (JP) ................ 2013-043170

(51) Int. Cl.
| | |
|---|---|
| *G02B 5/23* | (2006.01) |
| *G02F 1/1335* | (2006.01) |
| *G03F 7/00* | (2006.01) |
| *G03F 7/16* | (2006.01) |
| *G03F 7/20* | (2006.01) |
| *G03F 7/32* | (2006.01) |
| *G03F 7/004* | (2006.01) |
| *G03F 7/039* | (2006.01) |
| *G02B 5/22* | (2006.01) |
| *G02B 5/20* | (2006.01) |

(52) U.S. Cl.
CPC ....... *G03F 7/0007* (2013.01); *G02F 1/133514* (2013.01); *G02F 1/133516* (2013.01); *G03F 7/004* (2013.01); *G03F 7/039* (2013.01); *G03F 7/16* (2013.01); *G03F 7/20* (2013.01); *G03F 7/322* (2013.01); *G02B 5/201* (2013.01)

(58) Field of Classification Search
USPC .. 252/586; 349/106; 359/891, 885; 427/514; 430/7, 270.1, 280.1; 522/111; 216/24
See application file for complete search history.

(56) References Cited

U.S. PATENT DOCUMENTS

| | | | | |
|---|---|---|---|---|
| 6,517,980 | B2 * | 2/2003 | Ueda | G03F 7/0388 430/14 |
| 7,022,459 | B2 * | 4/2006 | Kodama | G03F 7/0392 430/270.1 |

FOREIGN PATENT DOCUMENTS

| | | | | |
|---|---|---|---|---|
| JP | 09-176511 A | | 7/1997 | |
| JP | 10-260532 | * | 9/1998 | ............. G03F 7/038 |
| JP | 10-260532 A | | 9/1998 | |
| JP | 11-095435 | * | 4/1999 | ............. G03F 7/039 |
| JP | 11-095435 A | | 4/1999 | |
| JP | 2000-221682 | * | 8/2000 | ............. G03F 7/038 |
| JP | 2000-221682 A | | 8/2000 | |
| JP | 2001-272524 A | | 10/2001 | |
| JP | 2006-30541 A | | 2/2006 | |
| JP | 2006-251296 | * | 9/2006 | ............... G02B 5/20 |
| JP | 2006-251296 A | | 9/2006 | |
| JP | 2008-145715 A | | 6/2008 | |

OTHER PUBLICATIONS

International Search Report of PCT/JP2014/055556, dated May 27, 2014. [PCT/ISA/210], English Translation.
Written Opinion of PCT/JP2014/055556, dated May 27, 2014. [PCT/ISA/237].
International Preliminary Report on Patentability dated Sep. 17, 2015, issued by the International Bureau in International Application No. PCT/JP2014/055556.
Office Action dated Apr. 12, 2016, from the Japanese Office in counterpart Japanese Application No. 2013-043170.
Office Action dated Nov. 14, 2016 in Korean Patent Application 10-2015-7022543.

* cited by examiner

*Primary Examiner* — Bijan Ahvazi
(74) *Attorney, Agent, or Firm* — Sughrue Mion, PLLC

(57) ABSTRACT

Provided is a colored photo-sensitive composition having a high sensitivity and a good developpablity, even if the ratio of content of a pigment, relative to the total solids of the colored photo-sensitive composition, is 20% by mass or more. The colored photo-sensitive composition includes (A) a resin which is increased, by action of an acid, in solubility into an alkali developing solution; (B) a pigment; (C) a compound which produces an acid upon irradiated by active light or radial ray; and (D) a solvent, wherein the ratio of content of the (B) pigment, relative to the total solids of the colored photo-sensitive composition, is 20% by mass or more.

16 Claims, No Drawings

COLORED PHOTO-SENSITIVE COMPOSITION, COLOR FILTER, AND METHOD FOR MANUFACTURING COLOR FILTER

CROSS-REFERENCE TO RELATED APPLICATIONS

This application is a Continuation of PCT International Application No. PCT/JP2014/055556 filed on Mar. 5, 2014, which claims priority under 35 U.S.C §119(a) to Japanese Patent Application No. 2013-043170 filed on Mar. 5, 2013. Each of the above application(s) is hereby expressly incorporated by reference, in its entirety, into the present application.

TECHNICAL FIELD

This invention relates to a colored photo-sensitive composition which is suitably used for manufacturing a color filter used in liquid crystal display device (LCD), solid-state imaging device (CCD, CMOS, etc.) and so forth, a color filter having a colored region formed by using the colored photo-sensitive composition, and a method for manufacturing the same.

BACKGROUND ART

Color filter is an indispensable constituent of liquid crystal display device and solid-state imaging device. In recent years, the liquid crystal display device has been required to achieve higher image quality, improved contrast and improved color purity, as compared with the devices required for the conventional ones having been used for television set and monitor. As for a colored photo-sensitive composition used for the color filter, efforts have been made on improving the contrast, by using a pigment particle of smaller size (see Patent Literature 1, for example). Also the color filter for the solid-state imaging device has been required to reduce non-uniformity of color for higher resolution, so that the color filter has been becoming more important to disperse a fine pigment having a small particle size without producing secondary aggregate.

Recent color filters, in particular the color filters for the liquid crystal display device, have been required to improve the color purity, and this needs increase in the content of pigment. Meanwhile, the color filters for solid-state imaging device have been required to reduce stray light due to scattering, as one measure for improving the resolution. It has therefore been a strong demand to thin the colored layers, so that increase in the content of pigment is also necessary in manufacture of the color filters for solid-state imaging device.

In order to increase the content of pigment, it is necessary to increase the pigment concentration in the colored photo-sensitive composition. However, too high pigment concentration inevitably decreases the content of a resin dispersant or a photo-sensitive component (monomer, polymerization initiator, etc.) in the colored photo-sensitive composition, so that the developability may degrade, and the patternability may degrade. In particular, the color filters for the solid-state imaging device, with an extremely reduced pattern size aimed at increasing the number of pixels and reducing size, have been suffering from degradation in developability (suppressive performance for residue in unexposed area).

Meanwhile, there have been known techniques of applying a comb-shaped resin composed of a trunk polymer having a cationic group, or a graft polymer composed of polyallylamine (see Patent Literatures 2, 3, for example). As a method for forming a pattern, there has been known a method for forming a positive pattern using a photo-acid generator and a resin which is improved, by action of an acid, insolubility into an alkali developing solution (see Patent Literature 4, for example).

CITATION LIST

Patent Literature

[Patent Literature 1] JP-A-2006-30541
[Patent Literature 2] JP-A-H09-176511
[Patent Literature 3] JP-A-2001-272524
[Patent Literature 4] JP-A-2008-145715

SUMMARY OF THE INVENTION

Technical Problem

It is therefore an object of this invention to provide a colored photo-sensitive composition having a high sensitivity and a good developability, even if the ratio of content of a pigment is 20% by mass or more, relative to the total solids of the colored photo-sensitive composition. It is another object of this invention to provide a color filter using the colored photo-sensitive composition, and a method for manufacturing a color filter.

Solution to Problem

After intensive studies conducted under such circumstances, the present inventors found out that a colored photo-sensitive composition unexpectedly showed a high sensitivity and a good developability, even if the ratio of content of a pigment is 20% by mass or more, relative to the total solids of the colored photo-sensitive composition, by using (A) a resin which is increased, by action of an acid, in solubility into an alkali developing solution, (B) a pigment, (C) a compound which produces an acid upon irradiated by active light or radial ray, and (D) a solvent. The finding led us to complete this invention.

Specifically the above problem was solved by the following <1>, preferably <2> to <12>.
<1> A colored photo-sensitive composition comprising: (A) a resin which is increased, by action of an acid, in solubility into an alkali developing solution; (B) a pigment; (C) a compound which produces an acid upon irradiated by active light or radial ray; and (D) a solvent, wherein the colored photo-sensitive composition has a ratio of content of the (B) pigment of 20% by mass or more, relative to the total solids of the colored photo-sensitive composition.
<2> The colored photo-sensitive composition of <1>, wherein the ratio of content of the (B) pigment is 60% by mass or more, relative to the total solids of the colored photo-sensitive composition.
<3> The colored photo-sensitive composition of <1> or <2>, wherein the (A) resin which is increased, by action of an acid, in solubility into an alkali developing solution further has, in a side chain, an oligomer or polymer chain having a weight-average molecular weight of 500 to 100,000.
<4> The colored photo-sensitive composition of any one of <1> to <3>, wherein the (A) resin which is increased, by action of an acid, in solubility into an alkali developing solution further has an acid group.

<5> The colored photo-sensitive composition of <4>, wherein the acid group is a carboxylic acid group.
<6> The colored photo-sensitive composition of any one of <1> to <6>, wherein the (A) resin which is increased, by action of an acid, in solubility into an alkali developing solution has a group represented by the formula (A-I) below:

[Chemical Formula 1]

Formula (A-I)

(in the formula (A-I), A represents a group eliminable by action of an acid.)
<7> The colored photo-sensitive composition of <6>, wherein the oligomer or polymer chain having a weight-average molecular weight of 500 to 100,000 has a group represented by the formula (A-I).
<8> A cured film obtainable by curing the colored photo-sensitive composition described in any one of <1> to <7>.
<9> A color filter having a colored layer using the colored photo-sensitive composition described in any one of <1> to <7>.
<10> The color filter of <9>, wherein the colored layer has a thickness of 0.2 to 3.0 μm.
<11> A method for manufacturing a color filter, the method comprising:
  a colored layer forming step, forming a colored layer by coating, over a support, the colored photo-sensitive composition described in any one of <1> to <7>;
  an exposure step, exposing pattern-wise the colored layer through a mask; and
  a developing step, forming a colored pattern by developing the exposed colored layer.
<12> A liquid crystal display device or solid-state imaging device comprising the color filter described in <9> or <10>, or the color filter manufactured by the method for manufacturing a color filter described in <11>.

Effect of the Invention

This invention makes possible to provide a composition improved in the developability, while keeping a high sensitivity, even if the pigment concentration is 20% by mass or more, relative to the total solids of the colored photo-sensitive composition.

EMBODIMENT FOR CARRYING OUT THE INVENTION

The present invention will be explained in detail below. As used herein, the numerical ranges expressed with "to" are used to mean the ranges including the values indicated before and after "to" as lower and upper limits.
In this specification, notation of group (atomic group) without being preceded by "substituted" or "unsubstituted", is used to encompass not only group having no substituent, but also group having substituent. For example, "alkyl group" encompass not only alkyl group having no substituent (unsubstituted alkyl group), but also alkyl group having substituent (substituted alkyl group).
In this specification, "(meth)acrylate" means acrylate and methacrylate, "(meth)acryl" means acryl and methacryl, and "(meth)acryloyl" means acryloyl and methacryloyl.

The "colored layer" in the context of this invention means pixels used for the color filter.
The pigment in this invention means a coloring compound not soluble in organic solvents. Now the specific organic solvents are exemplified typically by those enumerated later in the section of solvent. Accordingly, the coloring compound can dissolve into at least one of these organic solvents corresponds to the pigment in this invention.
In the specification, the colored region includes a color pixel (color pattern) region in a color filter and a forming region of shielding film.
In the specification, "Me" stands for methyl group, "Et" stand for ethyl group, and "Bu" stands for butyl group.
The colored photo-sensitive composition of this invention (also referred to as "the composition of this invention") contains (A) the resin which is improved, by action of an acid, in solubility into an alkali developing solution (also referred to as (A) acid-decomposable resin, hereinafter), (B) the pigment, (C) the compound which produces an acid upon irradiated by active light or radial ray, and (D) the solvent. Details will be given below. By using (A) the acid-decomposable resin and (C) the compound which produces an acid upon irradiated by active light or radial ray in combination, the composition of this invention may be improved in the developability, while keeping a high sensitivity, even if the pigment concentration in the composition of this invention is elevated. As a consequence, it makes possible to further thin the colored layer using the composition of this invention.

<(A) Resin which is Increased, Under Action of Acid, in Solubility into Alkali Developing Solution>

The (A) acid-decomposable resin used in the photo-sensitive composition of this invention is a resin which is increased, by action of an acid, in solubility into an alkali developing solution. The "resin which is increased, by action of an acid, in solubility into an alkali developing solution" means a resin which shows a larger solubility into an alkali developing solution than when an acid is allowed to act thereon, than when the acid is not allowed to act thereon, when examined while keeping conditions such as species of acid, alkali developing solution and temperature unchanged.
For example, (A) the acid-decomposable resin preferably has a group which makes, by action of an acid, the resin more soluble into the alkali developing solution (also referred to as "acid-decomposable group", hereinafter). (A) The acid-decomposable resin preferably has the acid-decomposable group at least either in the principal chain or in a side chain.
(A) The acid-decomposable resin preferably has a group which decomposes, by action of an acid, to produce an alkali-soluble group (also referred to as "alkali-soluble group", hereinafter).
"Alkali-solubilizing" in this invention means that a coated film (4 μm thickness) of the composition of this invention, typically formed by coating on a substrate and baked at 90° C. for 2 minutes, dissolves into a 0.4-wt % aqueous tetramethylammonium hydroxide solution at 23° C., at a dissolution rate of 0.01 μm/sec or faster.
The alkali-soluble group is exemplified by phenolic hydroxy group, carboxylic acid group, fluorinated alcohol group, sulfonic acid group, sulfonamide group, sulfonylimide group, (alkylsulfonyl) (alkylcarbonyl)methylene group, (alkylsulfonyl) (alkylcarbonyl)imide group, bis(alkylcarbonyl)methylene group, bis(alkylcarbonyl)imide group, bis (alkylsulfonyl)methylene group, bis(alkylsulfonyl)imide group, tris(alkylcarbonyl)methylene group, and tris(alkylsulfonyl)methylene group.

Preferable alkali-soluble group is exemplified by carboxylic acid group, fluorinated alcohol group (preferably hexafluoroisopropanol group), and sulfonic acid group. Among them, carboxylic acid group is particularly preferable.

The acid-decomposable group is preferably protected by a group which eliminates a hydrogen atom of the alkali-soluble group by action of an acid.

For example, the acid-decomposable group is preferably a group represented by the formula (A-I) below:

[Chemical Formula 2]

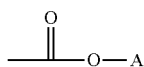

Formula (A-I)

(In the formula (A-I), A represents a group eliminable by action of an acid.)

While the group eliminable by action of an acid is not specifically limited, the group is preferably, for example, —C($R_{36}$)($R_{37}$)($R_{38}$), —C($R_{36}$)($R_{37}$)(O$R_{39}$), or —C($R_{01}$)($R_{02}$)(O$R_{39}$)

Each of $R_{36}$ to $R_{39}$ independently represents an alkyl group, alicyclic group, aryl group, aralkyl group or alkenyl group. $R_{36}$ and $R_{37}$ may combine with each other to form a ring.

Each of $R_{01}$ and $R_{02}$ independently represents a hydrogen atom, alkyl group, alicyclic group, aryl group, aralkyl group or alkenyl group.

The group represented by the formula (A-I) is preferably a cumyl ester group, enol ester group, acetal ester group, secondary alkyl ester group, tertiary alkyl ester group or the like, more preferably a tertiary alkyl ester group, and furthermore preferably an alicyclic tertiary alkyl ester group.

The group eliminable by action of an acid also preferably has a structure selected from those represented by the formulae (pI) to (pV) below.

[Chemical Formula 3]

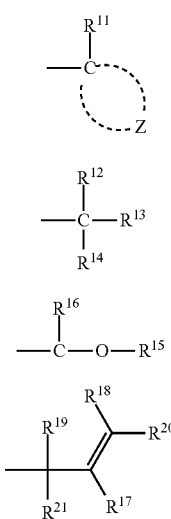

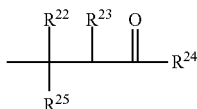

In the formulae (pI) to (pV), $R^{11}$ represents a straight chain-like alkyl group, and preferably a methyl group, ethyl group, n-propyl group, isopropyl group, n-butyl group, isobutyl group or sec-butyl group.

Z represents an atomic group necessary for forming an alicyclic group together with a carbon atom.

Each of $R^{12}$ to $R^{16}$ independently represents a hydrogen atom, straight chain-like or branched alkyl group having 1 to 4 carbon atoms, or alicyclic group.

Each of $R^{17}$ to $R^{21}$ independently represents a hydrogen atom, straight chain-like or branched alkyl group having 1 to 4 carbon atoms, or alicyclic group. At least one of $R^{17}$ to $R^{21}$ represents an alicyclic group. Either $R^{19}$ or $R^{21}$ represents a straight-chain or branched alkyl group having 1 to 4 carbon atoms, or alicyclic group.

Each of $R^{22}$ to $R^{25}$ independently represents a hydrogen atom, straight-chain or branched alkyl group having 1 to 4 carbon atoms, or alicyclic group. At least one of $R^{22}$ to $R^{25}$ represents an alicyclic group. $R^{23}$ and $R^{24}$ may combine with each other to form a ring.

The alicyclic group represented by $R^{12}$ to $R^{25}$, or, the alicyclic group formed by Z and a carbon atom may be monocyclic or polycyclic. More specifically, it is exemplified by groups having monocyclo-, bicyclo-, tricyclo- or tetracyclo-structure having 5 or more carbon atoms. Each of these alicyclic groups preferably has 6 to 30 carbon atoms, and particularly 7 to 25 carbon atoms. Each of these alicyclic groups may have a substituent, but preferably none.

Preferred alicyclic group is exemplified by adamantyl group, noradamantyl group, decalin residue, tricyclodecanyl group, tetracyclododecanyl group, norbornyl group, cedrol group, cyclopentyl group, cyclohexyl group, cycloheptyl group, cyclooctyl group, cyclodecanyl group, and cyclododecanyl group.

More preferable examples include adamantyl group, norbornyl group, cyclohexyl group, cyclopentyl group, tetracyclododecanyl group, and tricyclodecanyl group.

The substituent which may be possessed by the alkyl group and alicyclic group is exemplified by alkyl group (having 1 to 4 carbon atoms), halogen atom, hydroxy group, alkoxy group (having 1 to 4 carbon atoms), carboxyl group, and alkoxycarbonyl group (having 2 to 6 carbon atoms). The substituent which may further be possessed by the alkyl group, alkoxy group, or alkoxycarbonyl group is exemplified by hydroxy group, halogen atom, and alkoxy group.

The group eliminable by action of an acid preferably has a structure represented by any of the formulae (pI) to (pIII) above.

A preferable mode of structure represented by the formula (pI) is such that, in the formula (pI), an alicyclic group formed by Z and a carbon atom is an adamantyl group, norbornyl group, cyclohexyl group, cyclopentyl group, tetracyclododecanyl group, or tricyclodecanyl group, and $R^{11}$ represents a methyl group or ethyl group.

A preferable mode of structure represented by the formula (pII) is such that, in the formula (pII), each of $R^{12}$ to $R^{14}$ represents a methyl group.

A preferable mode of structure represented by the formula (pIII) is such that, in the formula (pIII), $R^{15}$ represents a methyl group or alicyclic group, and $R^{16}$ represents a hydrogen atom.

(A) The acid-decomposable resin preferably has a repeating unit represented by the formula (A-IIa) below.

[Chemical Formula 4]

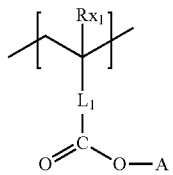

Formula (A-IIa)

(In the formula (A-IIa), $R_{x1}$ represents a hydrogen atom or methyl group, $L^1$ represents a single bond or divalent linking group, and A represents a group eliminable by action of an acid.)

In the formula (A-IIa), $L^1$ represents a single bond or divalent linking group. The divalent linking group is preferably configured by any combination of aryl group having 6 to 18 carbon atoms, —(CH$_2$)$_m$— (m is an integer of 1 to 10, preferably an integer of 1 to 6), —O—, —COO—, —S—, —C(OH)—, and —CO—.

In the formula (A-IIa), A is synonymous to A in the formula (I) (group eliminable by action of an acid), wherein the same will apply also to the preferable ranges.

In particular, (A) the acid-decomposable resin preferably has a repeating unit represented by the formulae (A-IIb) to (A-IId) below, and more preferably has a repeating unit represented by the formula (A-IIb).

[Chemical Formula 5]

(A-IIb)

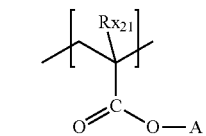

(A-IIc)

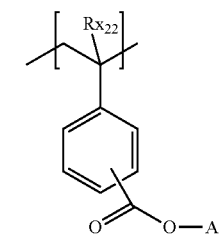

(A-IId)

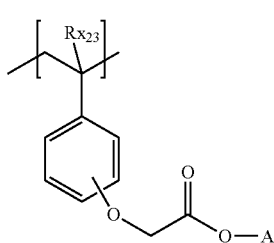

(In the formulae (A-IIb) to (A-IId), each of $R_{x21}$ to $R_{x23}$ independently represents a hydrogen atom or methyl group, and A represents a group eliminable by action of an acid.)

In the formula (A-IIb), A is synonymous to A in the formula (I) (group eliminable by action of an acid), wherein the same will apply also to the preferable ranges.

Specific examples of the repeating unit represented by the formulae (A-IIb) to (A-IId) will be shown below, without limiting this invention.

[Chemical Formula 6]

1

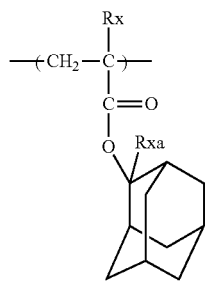

2

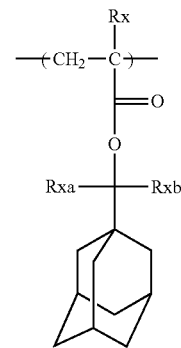

3

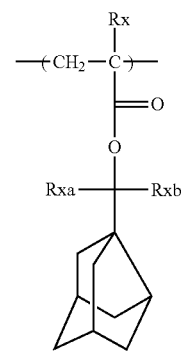

4

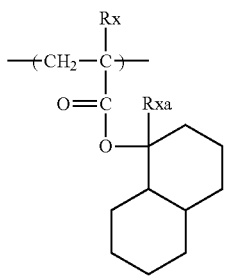

5

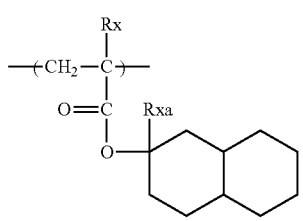

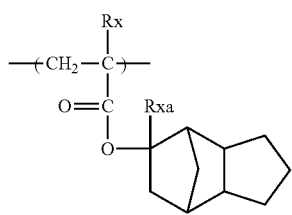
6
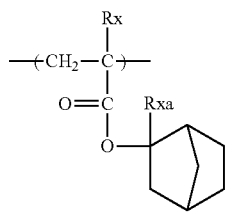
7
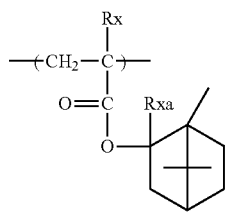
8
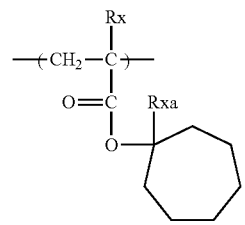
9
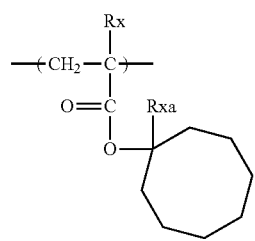
10
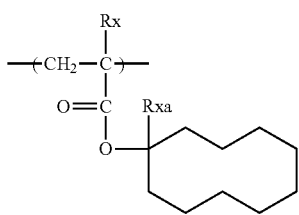
11
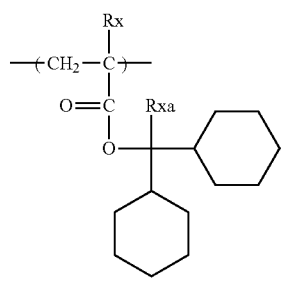
12
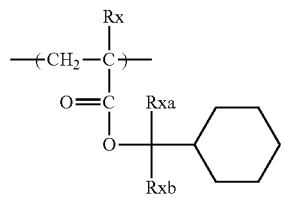
13
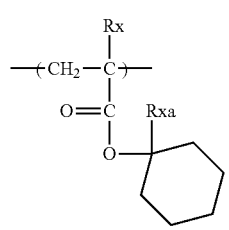
14
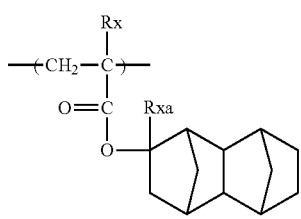
15
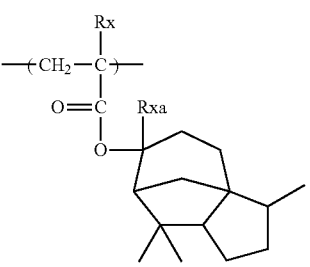
16
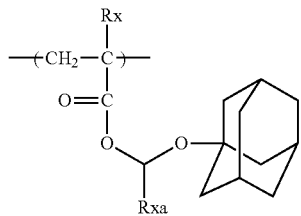
17
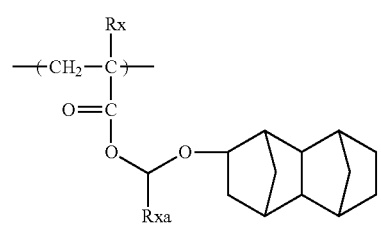
18
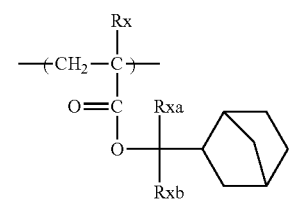
19

-continued

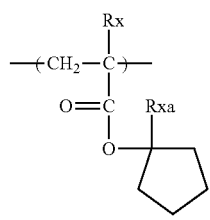

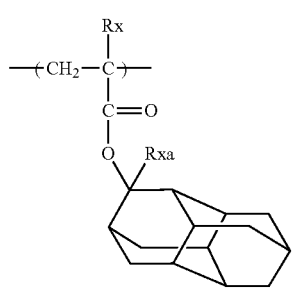

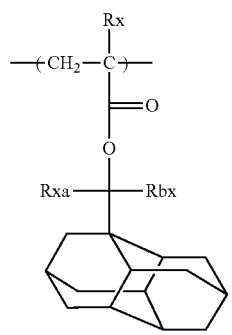

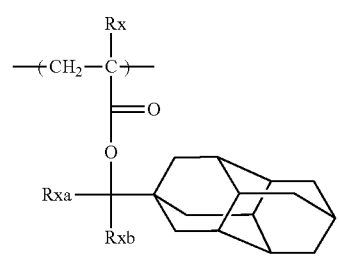

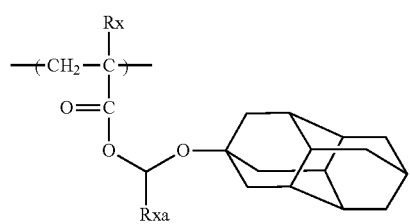

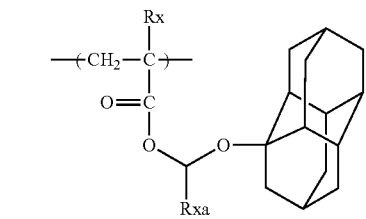

(in the formula, x represents H, $CH_3$, $CF_3$, or $CH_2OH$; and Rxa and Rxb each represents an alkyl group having 1 to 4 carbon atoms.)

In the specific examples shown below, each of Rx and $Xa_1$ represents a hydrogen atom, $CH_3$, $CF_3$, or $CH_2OH$. Each of Rxa and Rxb independently represents an alkyl group having 1 to 4 carbon atoms. Z represents a substituent having a polar group. If there are a plurality of (Z)s, each Z is independent. p represents an integer of 0 or positive integer.

[Chemical Formula 7]

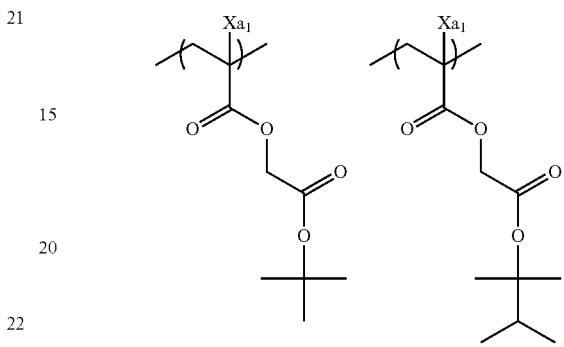

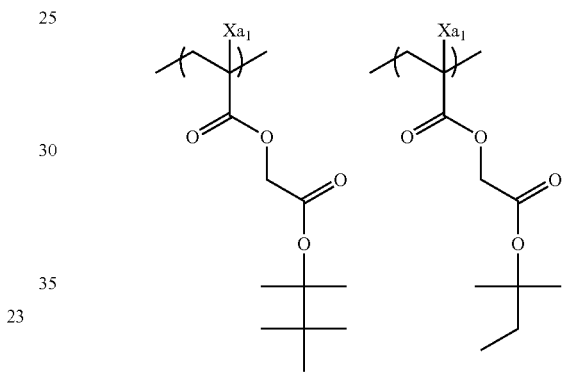

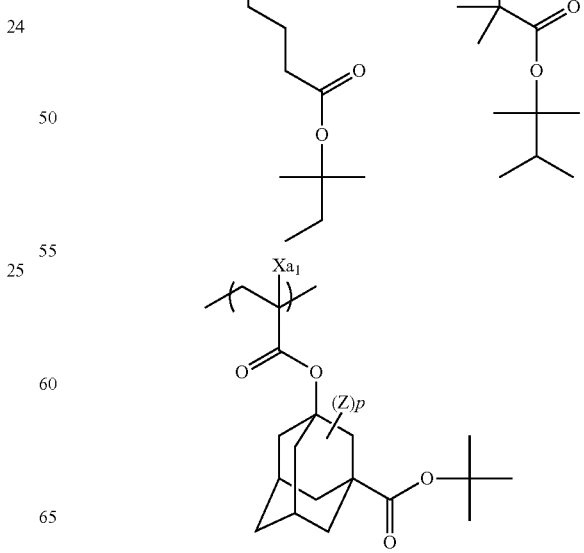

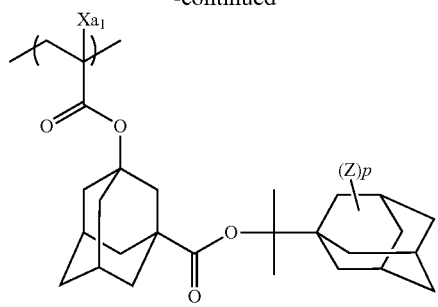
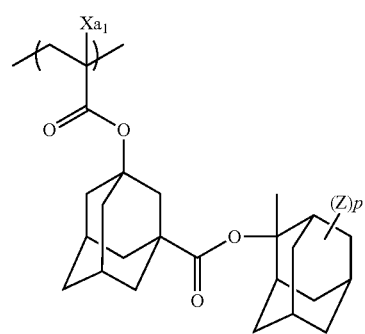
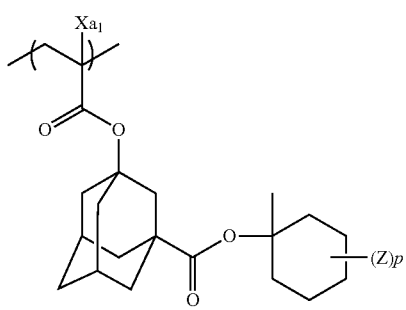
[Chemical Formula 8]
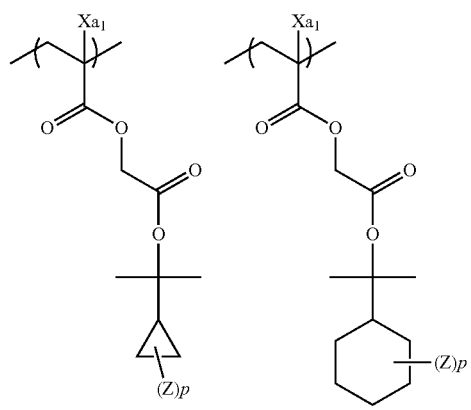
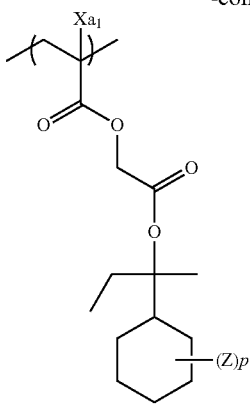
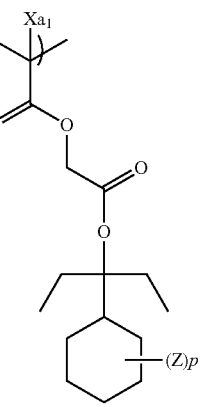
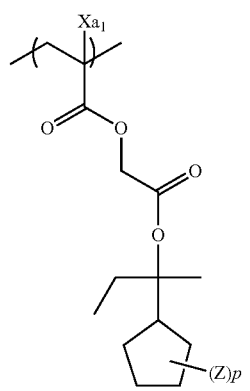

-continued
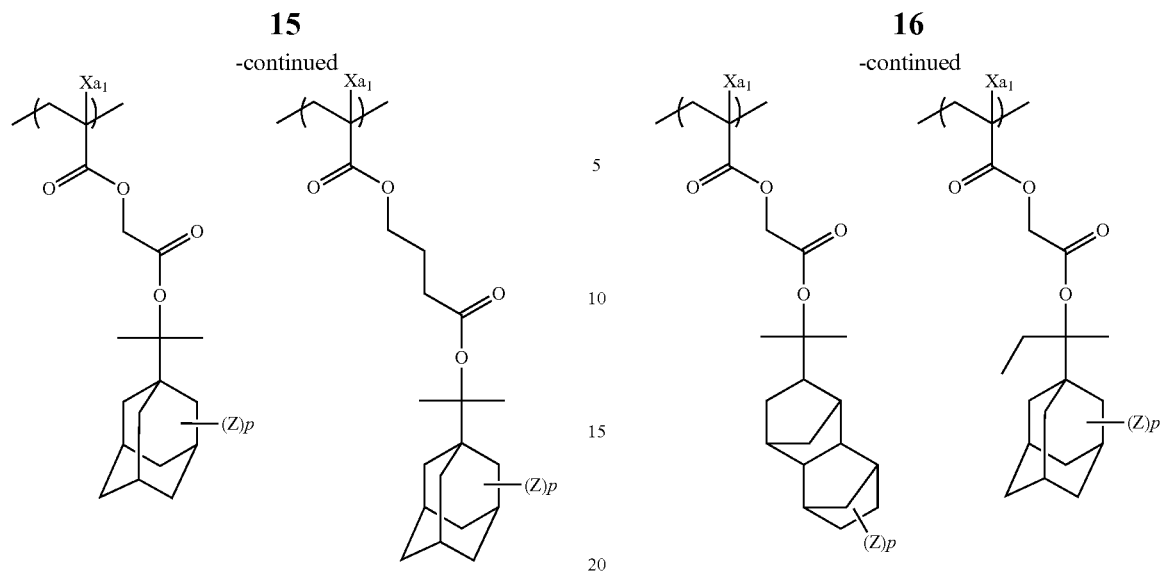
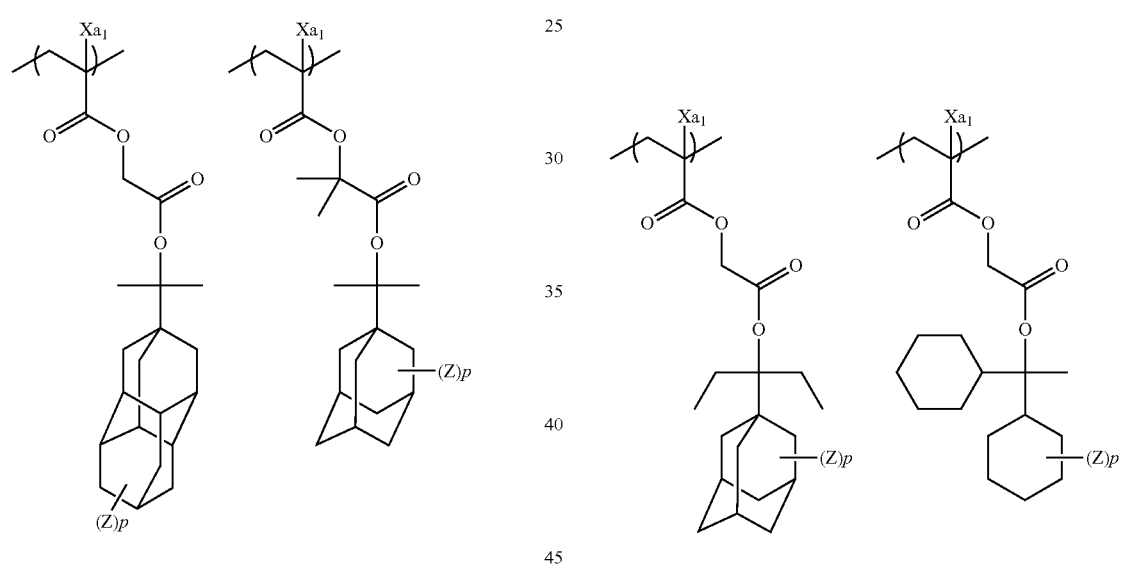
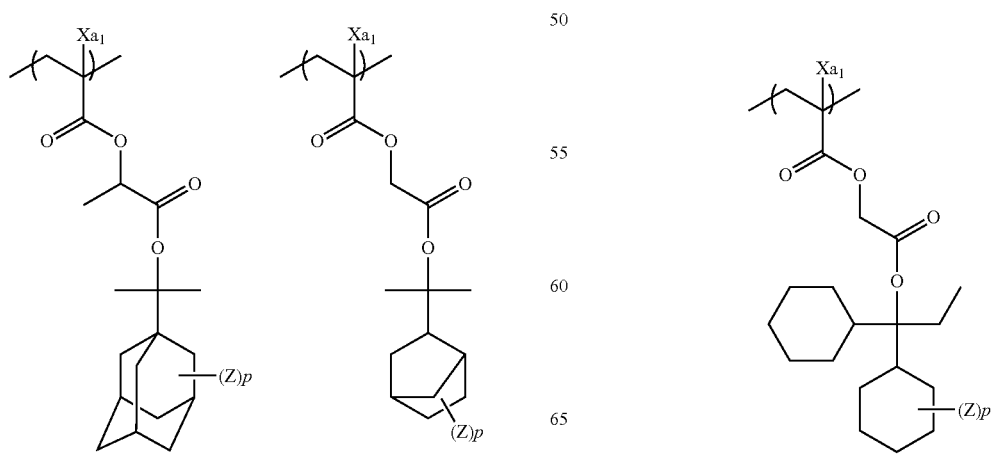

-continued
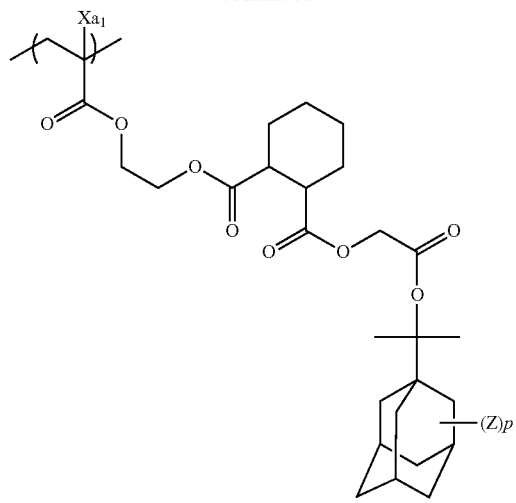
[Chemical Formula 9]
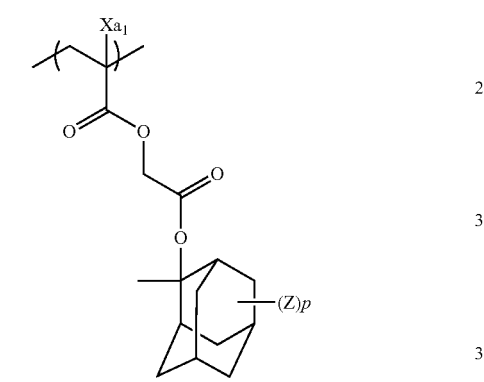
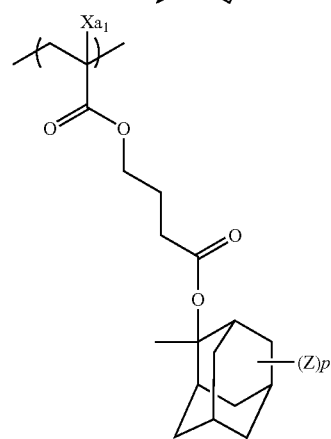
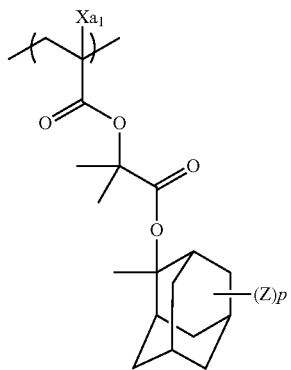
-continued
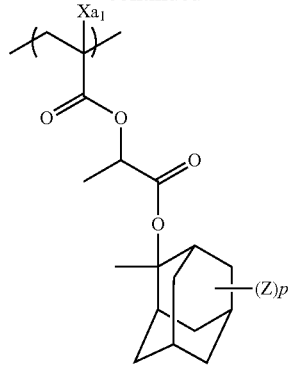
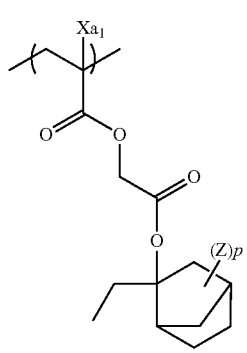
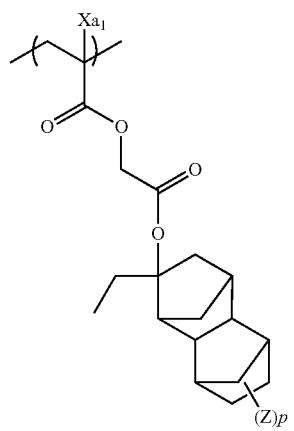
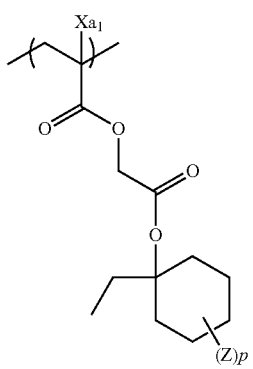 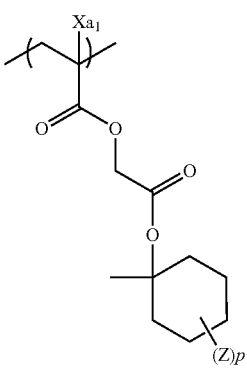

-continued
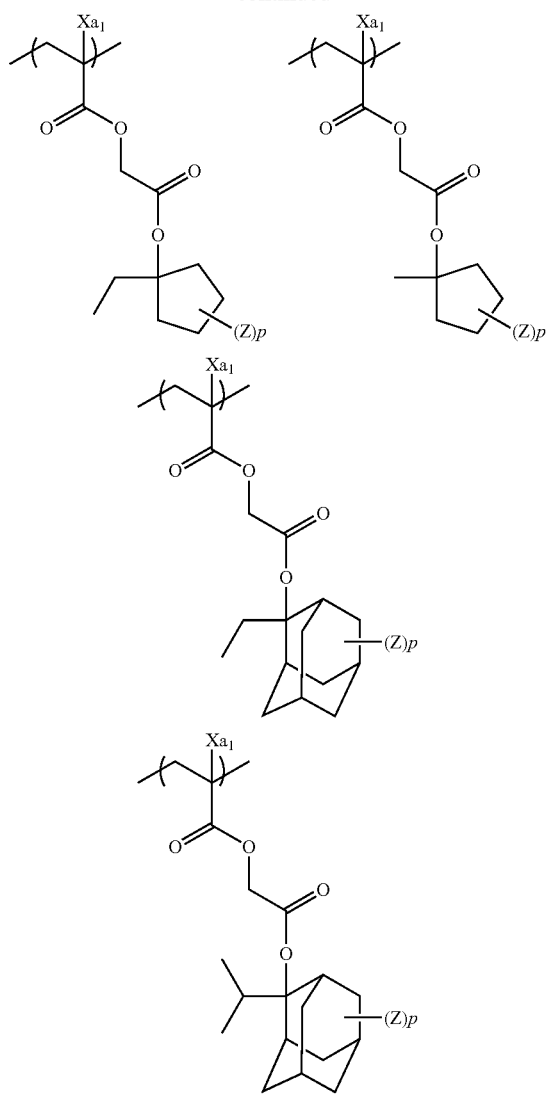
[Chemical Formula 10]
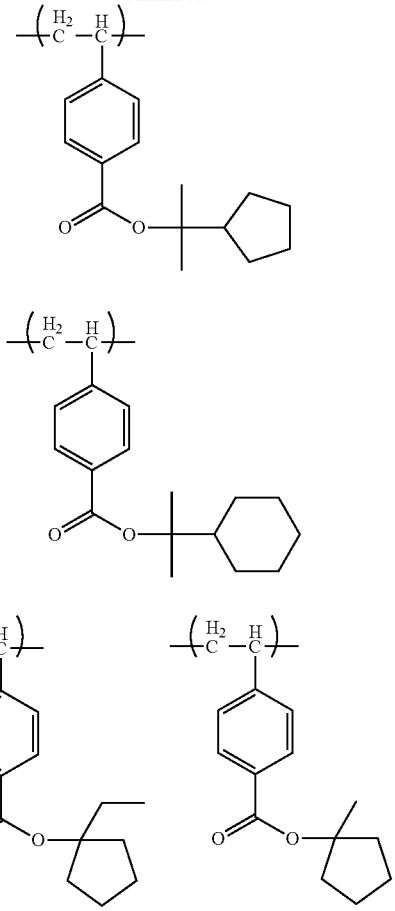
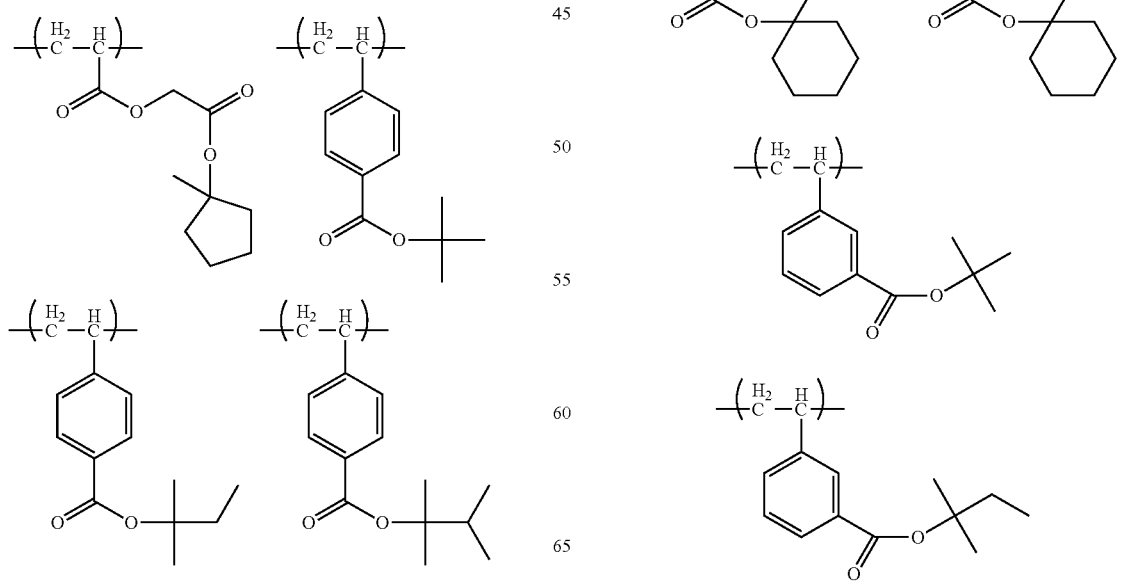

21
-continued
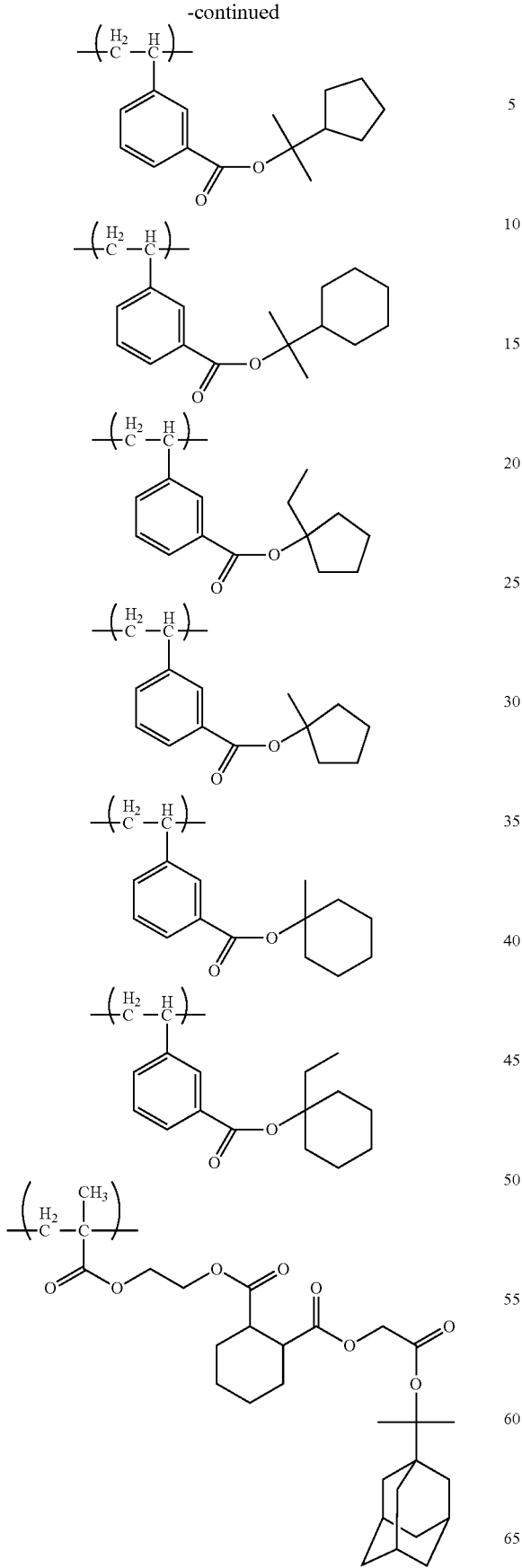
22
-continued
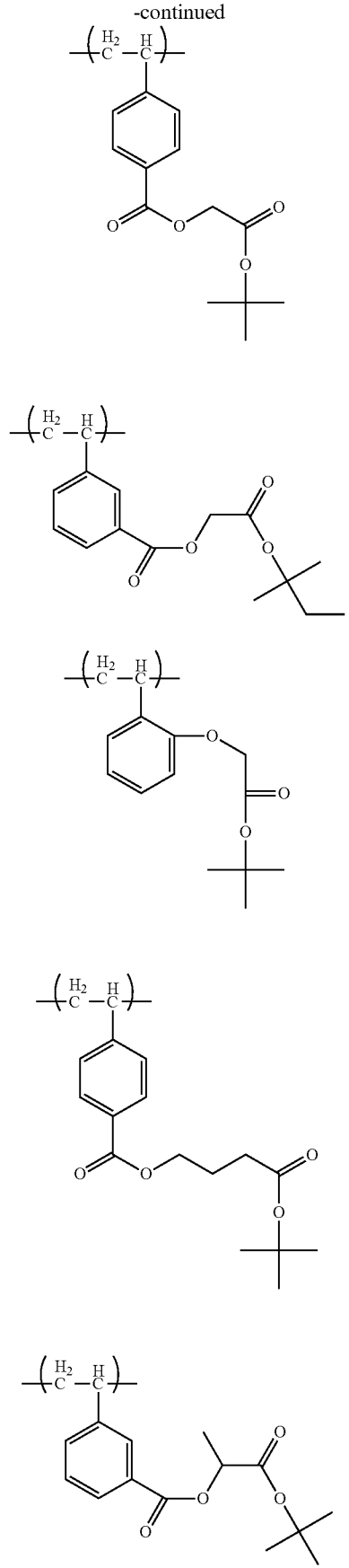

[Chemical Formula 11]
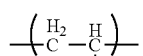 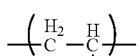
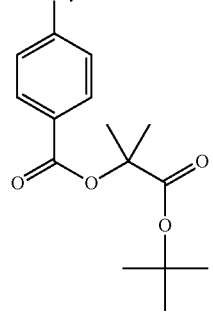 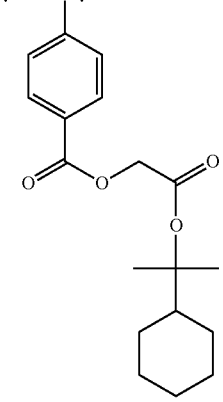
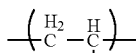 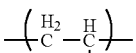
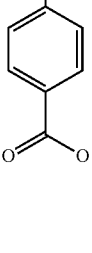 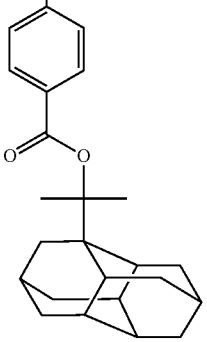
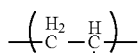 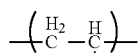
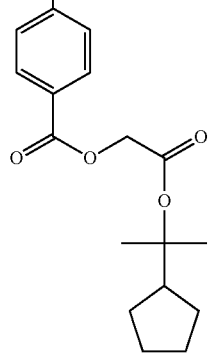 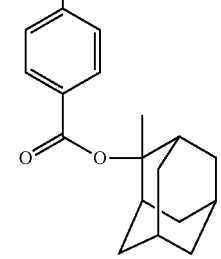
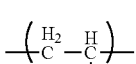
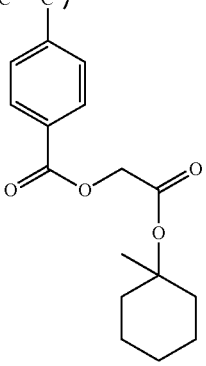
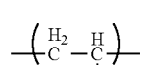
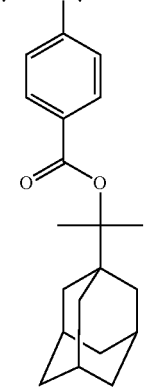
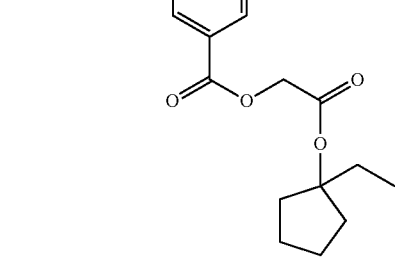
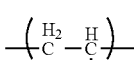
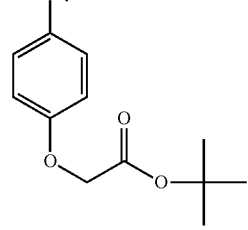

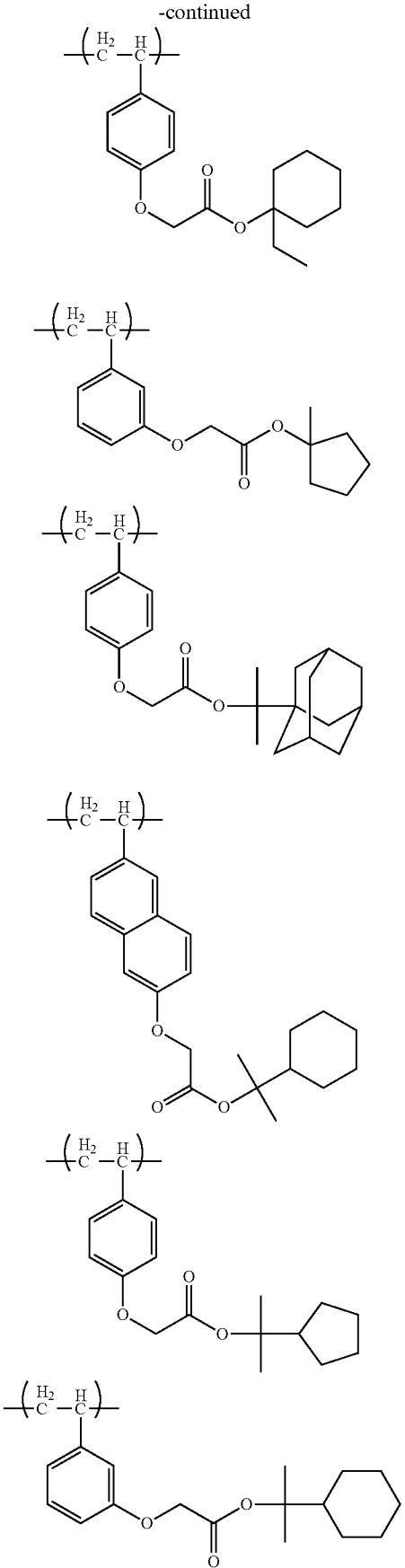

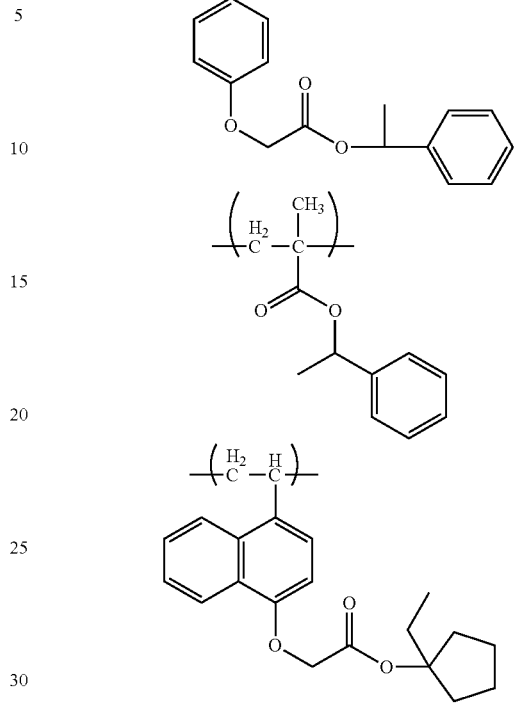

The content of the constituent having the acid-decomposable group, in (A) the acid-decomposable resin, is preferably 1 to 30 mol %, more preferably 3 to 20 mol %, and furthermore preferably 3 to 15 mol %.

When the constituent having the acid-decomposable group is contained in an oligomer or polymer chain having a weight-average molecular weight of 500 to 100,000 as described later, the number of moles of the total constituents in (A) the acid-decomposable resin is calculated so as to include the number of moles of the oligomer or polymer chain having a weight-average molecular weight of 500 to 100,000.

<<Oligomer or Polymer Chain having Weight-Average Molecular Weight of 500 to 100,000>>

It is preferable that (A) the acid-decomposable resin further contain an oligomer or polymer chain (steric repulsive group) having a weight-average molecular weight of 500 to 100,000. While not adhering to any theory, since the (A) acid-decomposable resin contains the oligomer or polymer chain having a weight-average molecular weight of 500 to 100,000, the resin which is increased, by action of an acid, in solubility into an alkali developing solution is supposed to distribute uniformly in the film, so that the composition of this invention, when formed into a film, enables high efficiency photo-patterning over the entire film, and is therefore understood to be further improved in the developability under a high concentration condition of pigment.

The oligomer or polymer chain having a weight-average molecular weight of 500 to 100,000 may arbitrarily be selectable from the oligomers and polymers already known. Preferable examples include those of polyacryl-base, polyester-base, polyurethane-base, polyamide base, and polyimide base; and more preferable examples include those of polyacryl-base and polyester-base. In particular, the individual oligomers or polymers of polyacryl-base and polyester-base are preferable. Polymethyl(meth)acrylate, polyethyl(meth)acryl, and poly(ε-caprolactone) are particularly preferable.

For example, the oligomer or polymer chain having a weight-average molecular weight of 500 to 100,000 is preferably a hydrocarbon group, or a group configured by combining the hydrocarbon group with —O—, —COO—, —S—, —CO— or the like. The hydrocarbon group is preferably a chain-like or branched alkyl group, more preferably chain-like or branched alkyl group having 1 to 6 carbon atoms, and particularly a straight chain-like alkyl group having 1 to 3 carbon atoms.

The oligomer or polymer chain having a weight-average molecular weight of 500 to 100,000 preferably has a constitutive unit represented by the formula (A-III) below.

[Chemical Formula 12]

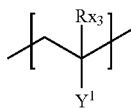

Formula (A-III)

(In the formula (A-III), $R_{x3}$ represents a hydrogen atom or methyl group, and $Y^1$ represents a monovalent substituent.)

$Y^1$ represents a monovalent substituent. The monovalent substituent is preferably a hydrocarbon group, or a group configured by combining the hydrocarbon group with —O—, —COO—, —S—, —CO— or the like. The hydrocarbon group is more preferably a chain-like or branched alkyl group, furthermore preferably a chain-like or branched alkyl group having 1 to 6 carbon atoms, and particularly a straight chain-like alkyl group having 1 to 3 carbon atoms.

The oligomer or polymer chain having a weight-average molecular weight of 500 to 100,000 is exemplified by the exemplary compound below, without limiting this invention. In the compound below, $R_{x31}$ represents a hydrogen atom or methyl group. $Y^{11}$ represents a chain-like or branched alkyl group having 1 to 6 carbon atoms, and preferably a straight chain-like alkyl group having 1 to 3 carbon atoms.

[Chemical Formula 13]

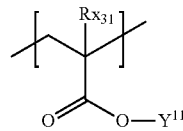

In particular in the (A) acid-decomposable resin, the oligomer or polymer chain, having a weight-average molecular weight of 500 to 100,000, preferably has an acid-decomposable group. That is, the acid-decomposable group is preferably contained in the oligomer or polymer chain having a weight-average molecular weight of 500 to 100,000.

While not adhering to any theory, since the oligomer or polymer chain having a weight-average molecular weight of 500 to 100,000 contains the acid-decomposable group, the acid-decomposable group is supposed to distribute uniformly in the film, so that the composition of this invention, when formed into a film, enables high efficiency photopatterning over the entire film, and is therefore understood to be further improved in the developability under a high concentration condition of pigment.

In a specific mode that the oligomer or polymer chain having a weight-average molecular weight of 500 to 100,000 has the acid-decomposable group, a constitutive unit represented by the formula (A-IV) below is preferably contained.

[Chemical Formula 14]

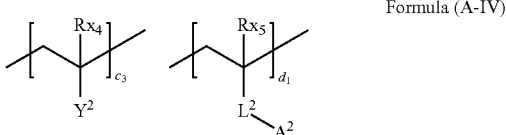

Formula (A-IV)

(In the formula (A-IV), each of $R_{x4}$ and $R_{x5}$ independently represents a hydrogen atom or methyl group, $Y^2$ represents a monovalent substituent, $L^2$ represents a single bond or divalent linking group, and $A^2$ represents an acid-decomposable group.)

In the formula (A-IV), $Y^2$ represents a monovalent substituent, and is synonymous to $Y^1$ in the formula (A-III), wherein the same will apply also to the preferable ranges.

In the formula (A-IV), $L^2$ represents a single bond or divalent linking group, and preferably a single bond. The divalent linking group is preferably an arylene group (preferably phenylene group), alkylene group [preferably $(CH_2)_m$ (m represents an integer of 1 to 10, preferably 1 to 6)], —O—, —COO—, —S—, —C(OH)—, —CO—, etc., or, group configured by combining them. It is particularly preferable that $L^2$ is represented by -$L^3$-COO— ($L^3$ represents a single bond or phenylene group, where $L^3$ is bound to a polymer chain).

In the formula (A-IV), $A^2$ is synonymous to the acid-decomposable group represented by the formula (A-I), wherein the same will apply also to the preferable ranges.

In the formula (A-IV), molar ratio of $c_3$ and $d_1$ is preferably 0.5 to 10:1, and more preferably 1 to 6:1.

Specific examples of the oligomer or polymer chain, having a weight-average molecular weight of 500 to 100,000, will be enumerated below, without limiting this invention.

[Chemical Formula 15]

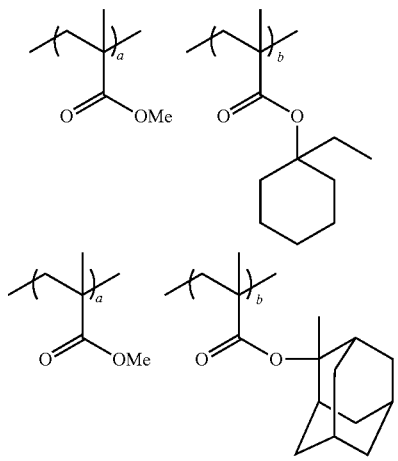

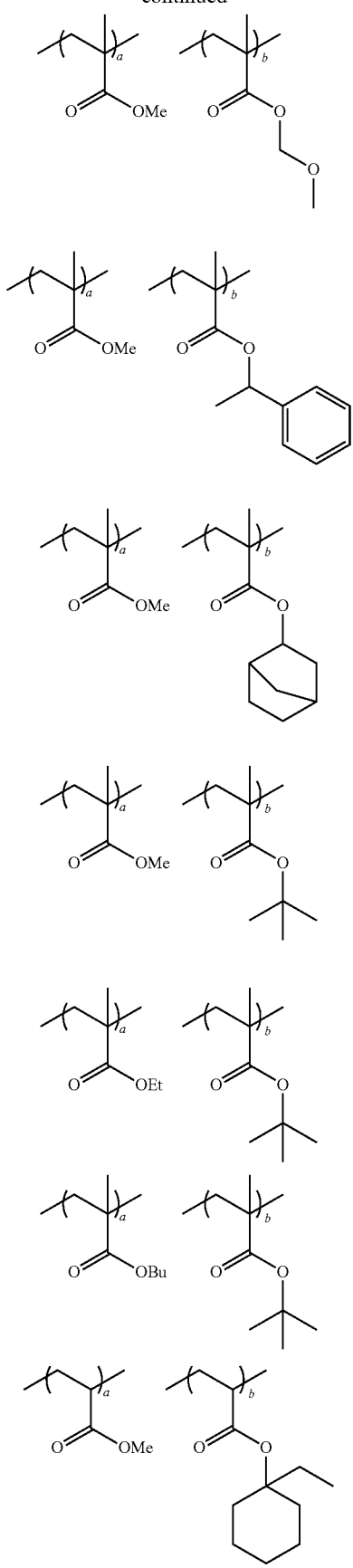
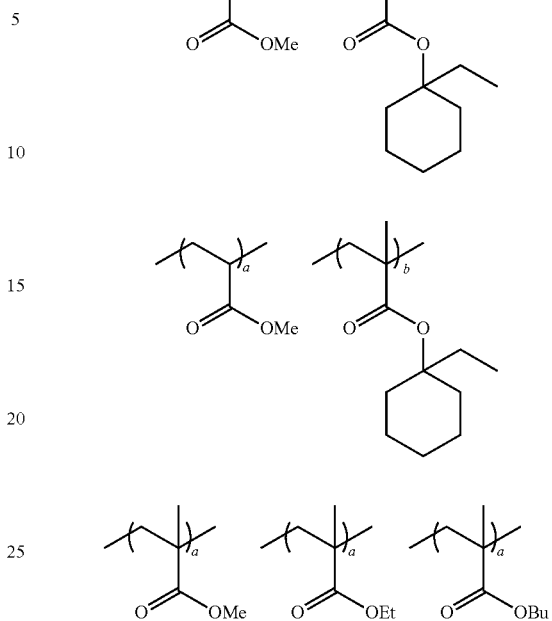

The oligomer or polymer chain having a weight-average molecular weight of 500 to 100,000 preferably contains 5 to 60 mol %, preferably 15 to 50 mol %, of the acid-decomposable group.

(a2) The oligomer or polymer chain having a weight-average molecular weight of 500 to 100,000 preferably has a weight-average molecular weight of 1,000 to 50,000, more preferably 2,000 to 10,000, furthermore preferably 3000 to 9,000, and particularly 3,000 to 7,000.

<<Acid Group>>

(A) It is preferable that the acid-decomposable resin further has an acid group. (A) The acid-decomposable resin, introduced with the acid group, will show an improved dispersibility which is ascribable to adsorption of the acid group to the basic moiety of the pigment surface, and thereby the shelf stability and developability of the composition of this invention may further be improved.

The acid group now represents a group having a functional group with a pKa of 6 or smaller at a water temperature of 25° C. pKa is defined in "Kagaku Binran, *in Japanese*, (Handbook of Chemistry) (II)", (revised fourth edition, 1993, edited by The Chemical Society of Japan, Published by Maruzen Co., Ltd.). The acid group used in this invention is not specifically limited in terms of structure, so long as it contains a functional group capable of adsorbing on the pigment by chemical adsorption or physical adsorption, and having a pKa of 6 or smaller. More specifically, preferable examples of the acid group include carboxylic acid (pKa: approx. 3 to 5), sulfonic acid (pKa: approx. −3 to −2), and phosphoric acid (pKa: approx. 2), wherein carboxylic acid is particularly preferable.

The acid group preferably has a structure having a constitutive unit represented by the formula (A-V) below.

[Chemical Formula 16]

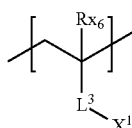

Formula (A-V)

(In the formula (A-V), $R^{x6}$ represents a hydrogen atom or methyl group, $L^3$ represents a single bond or divalent linking group, and $X^1$ represents an acid group.)

In the formula (A-V), $L^3$ represents a single bond or divalent linking group, and is preferably —$(CH_2)_m$— (m represents an integer of 1 to 10, more preferably an integer of 1 to 6), phenylene group, —O—, —COO—, —S—, —CO—, etc., or, group configured by combining them.

In the formula (A-V), $X^1$ represents the acid group. The acid group is preferably carboxylic acid group.

Specific examples of the acid group may be referred, for example, to the description of paragraph [0047] of International Patent WO2010/110491, the content of which is incorporated by reference into this specification.

The acid value of the acid group in (A) the acid-decomposable resin is preferably 20 to 140 mgKOH/g, more preferably 20 to 120 mgKOH/g, furthermore preferably 20 to 100 mgKOH/g, and particularly 40 to 80 mgKOH/g. With the acid value of the acid group in (A) the acid-decomposable resin controlled in these ranges, the composition of this invention may further be improved in the developability.

Preferable modes of (A) the acid-decomposable resin used in this invention are enumerated as below:

(1) a mode characterized by the oligomer or polymer chain, having a weight-average molecular weight of 500 to 100,000, has the acid-decomposable group;

(2) a mode characterized by (A) the acid-decomposable resin further has the acid group; and (3) a mode based on a combination of (1) and (2).

In particular, a preferable mode of (A) the acid-decomposable resin relates to a structure having a constitutive unit represented by the formula (A-VI) below. In the structure having the constitutive unit represented by the formula (A-VI) below, "a" and "b" polymerize to form the same chain, and, "c" and "d" polymerize to form the same chain.

[Chemical Formula 17]

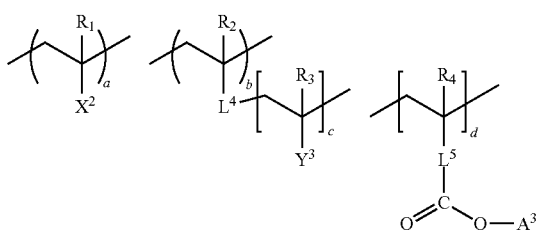

Formula (A-VI)

(In the formula (A-VI), each of $R^1$ to $R^4$ independently represents a hydrogen atom or methyl group, $X^2$ represents an acid group, each of $L^4$ and $L^5$ independently represents a divalent linking group, $Y^3$ represents a monovalent substituent, and $A^3$ represents a group eliminable by action of an acid.)

In the formula (A-VI), $X^2$ represents the acid group, which is synonymous to $X^1$ in the formula (A-V).

In the formula (A-VI), each of $L^4$ and $L^5$ independently represents a divalent linking group. $L^4$ is preferably a group configured by combining —$(CH_2)_m$— (m represents an integer of 1 to 10, more preferably an integer of 1 to 6), —O—, —COO—, —S—, —C(OH)—CO—, etc. $L^5$ is synonymous to $L^2$ in the formula (A-IV), wherein the same will apply also to the preferable ranges.

In the formula (A-VI), $Y^3$ represents a monovalent substituent, and is synonymous to $Y^1$ in the formula (A-III), wherein the same will apply also to the preferable ranges.

$A^3$ in the formula (A-V) is synonymous to A in the formula (I), wherein the same will apply also to the preferable ranges.

In the formula (A-VI), the molar ratio of a and b and c and d (a:b:c:d) is preferably (0.1 to 5):(2 to 20):(0.5 to 10):(1), and more preferably (0.5 to 3):(4 to 10):(1 to 6):(1).

(A) The acid-decomposable resin used in this invention preferably has a weight-average molecular weight of 10,000 to 50,000, and more preferably 15,000 to 30,000. With the weight-average molecular weight of (A) the acid-decomposable resin controlled in these ranges, the developability and dispersibility of pigment may be improved.

The content of (A) the acid-decomposable resin in the photo-sensitive composition of this invention is preferably 0.1 to 20% by mass relative to the total solids in the photo-sensitive composition of this invention, more preferably 0.5 to 15% by mass, and furthermore preferably 1 to 10% by mass.

<Method for Synthesizing (A) Acid-Decomposable Resin>

Method for synthesizing (A) the acid-decomposable resin may typically be as be explained below, without special limitation.

(I) A synthetic method based on polymerization of a monomer having the acid-decomposable group, with other optional monomer.

(II) A synthetic method based on introduction of an acid-decomposable group into a polymer.

Among them, (I) is particularly preferable since the content of the acid-decomposable group is controllable more easily. Method for polymerization is arbitrarily selectable from known methods, such as radical polymerization, anionic polymerization, cationic polymerization, polycondensation, and polyaddition.

<(B) Pigment>

The pigment used in this invention may be any of a variety of known inorganic pigment and organic pigment.

The pigment used in this invention is preferably as fine as possible. Taking the handleability into consideration, the pigment used in this invention preferably has a primary particle size of 100 nm or smaller for example, more preferably 5 to 80 nm, and furthermore preferably 5 to 50 nm. The primary particle size of the pigment may be measured by any of known methods, typically under an electron microscope.

The inorganic pigment used for the colored photo-sensitive composition of this invention is exemplified by metal compounds such as metal oxide and metal complex. More specifically, the examples include oxides of iron, cobalt, aluminum, cadmium, lead, copper, titanium, magnesium, chromium, zinc and antimony; and complex oxides of these metals.

The organic pigment usable for the colored photo-sensitive composition of this invention is exemplified by C.I. Pigment Yellows 1, 1:1, 2, 3, 4, 5, 6, 9, 10, 12, 13, 14, 16, 17, 24, 31, 32, 34, 35, 35:1, 36, 36:1, 37, 37:1, 40, 41, 42, 43, 48, 53, 55, 61, 62, 62:1, 63, 65, 73, 74, 75, 81, 83, 87, 93, 94, 95, 97, 100, 101, 104, 105, 108, 109, 110, 111, 116, 117, 119, 120, 126, 127, 127:1, 128, 129, 133, 134, 136, 138, 139, 142, 147, 148, 150, 151, 153, 154, 155, 157, 158, 159, 160, 161, 162, 163, 164, 165, 166, 167, 168, 169, 170, 172, 173, 174, 175, 176, 180, 181, 182, 183, 184, 185, 188, 189, 190, 191, 191:1, 192, 193, 194, 195, 196, 197, 198, 199, 200, 202, 203, 204, 205, 206, 207, 208;

C.I. Pigment Oranges 1, 2, 5, 13, 16, 17, 19, 20, 21, 22, 23, 24, 34, 36, 38, 39, 43, 46, 48, 49, 61, 62, 64, 65, 67, 68, 69, 70, 71, 72, 73, 74, 75, 77, 78, 79;

C.I. Pigment Reds 1, 2, 3, 4, 5, 6, 7, 8, 9, 12, 14, 15, 16, 17, 21, 22, 23, 31, 32, 37, 38, 41, 47, 48, 48:1, 48:2, 48:3, 48:4, 49, 49:1, 49:2, 50:1, 52:1, 52:2, 53, 53:1, 53:2, 53:3, 57, 57:1, 57:2, 58:4, 60, 63, 63:1, 63:2, 64, 64:1, 68, 69, 81, 81:1, 81:2, 81:3, 81:4, 83, 88, 90:1, 101, 101:1, 104, 108, 108:1, 109, 112, 113, 114, 122, 123, 144, 146, 147, 149, 151, 166, 168, 169, 170, 172, 173, 174, 175, 176, 177, 178, 179, 181, 184, 185, 187, 188, 190, 193, 194, 200, 202, 206, 207, 208, 209, 210, 214, 216, 220, 221, 224, 230, 231, 232, 233, 235, 236, 237, 238, 239, 242, 243, 245, 247, 249, 250, 251, 253, 254, 255, 256, 257, 258, 259, 260, 262, 263, 264, 265, 266, 267, 268, 269, 270, 271, 272, 273, 274, 275, 276;

C.I. Pigment Violets 1, 1:1, 2, 2:2, 3, 3:1, 3:3, 5, 5:1, 14, 15, 16, 19, 23, 25, 27, 29, 31, 32, 37, 39, 42, 44, 47, 49, 50;

those obtainable by replacing a Cl substituent of C.I. Pigment Blues 1, 1:2, 9, 14, 15, 15:1, 15:2, 15:3, 15:4, 15:6, 16, 17, 19, 25, 27, 28, 29, 33, 35, 36, 56, 56:1, 60, 61, 61:1, 62, 63, 66, 67, 68, 71, 72, 73, 74, 75, 76, 78, 79, and 79 with OH; C.I. Pigment Greens 1, 2, 4, 7, 8, 10, 13, 14, 15, 17, 18, 19, 26, 36, 45, 48, 50, 51, 54, 55;

C.I. Pigment Browns 23, 25, 26;

C.I. Pigment Blacks 1, 7; and carbon black, acetylene black, lamp black, bone black, graphite, iron black, aniline black, cyanine black, and titanium black.

In this invention, it is particularly preferable to use the pigment having a basic N atom in the structural formula. The pigment having a basic N atom shows a good dispersibility in the colored photo-sensitive composition of this invention. While the reason remains not fully clarified, a high affinity between the photo-sensitive polymerizable component and the pigment is supposed to exhibit a good effect.

The pigment preferably used in this invention is exemplified by those enumerated below, without limiting this invention.

C.I. Pigment Yellows 11, 24, 108, 109, 110, 138, 139, 150, 151, 154, 167, 180, 185;

C.I. Pigment Oranges 36, 71;

C.I. Pigment Reds 122, 150, 171, 175, 177, 209, 224, 242, 254, 255, 264;

C.I. Pigment Violets 19, 23, 32;

C.I. Pigment Blues 15:1, 15:3, 15:6, 16, 22, 60, 66,

C.I. Pigment Greens 7, 36, 37, 55; and

C.I. Pigment Black 1.

These organic pigment may be used independently, or may be combined in various ways for the purpose of improving color purity. Preferable modes of use and specific examples of combination of the organic pigments will be enumerated below.

As a red pigment, any one of anthraquinone-base pigment, perylene-base pigment, and diketopyrrolopyrrole-base pigment may be used independently, or, at least one of them may be mixed with disazo-base yellow pigment, isoindolinone-base yellow pigment, quinophthalone-base yellow pigment, or perylene-base red pigment.

The anthraquinone-base pigment is exemplified by C.I. Pigment Pigment Red 177, the perylene-base pigment is exemplified by C.I. Pigment Red 155 and C.I. Pigment Red 224, and the diketopyrrolopyrrole-base pigment is exemplified by C.I. Pigment Red 254. From the viewpoint of color separability, mixing with C.I. Pigment Yellow 139 is preferable.

Ratio by mass of the red pigment and the yellow pigment is preferably 100:5 to 100:50, and more preferably 100:10 to 100:30, taking a relation between the light transmittance and color separability into account.

When the red pigments are mutually combined, the ratio by mass of the pigments may be controlled depending on target spectral characteristic.

As a green pigment, halogenated phthalocyanine-base pigment may be used independently, or, this pigment may be mixed with disazo-base yellow pigment, quinophthalone-base yellow pigment, azomethine-base yellow pigment, or isoindolinone-base yellow pigment. For example, C.I. Pigment Greens 7, 36, 37 are preferably mixed with C.I. Pigment Yellow 83, C.I. Pigment Yellow 138, C.I. Pigment Yellow 139, C.I. Pigment Yellow 150, C.I. Pigment Yellow 180, or C.I. Pigment Yellow 185.

Ratio by mass of the green pigment and the yellow pigment is preferably 100:5 to 100:150, and more preferably 100:30 to 100:120.

As a blue pigment, phthalocyanine-base pigment may be used independently, or, this pigment may be mixed with dioxazine-base violet pigment. For example, mixture of C.I. Pigment Blue 15:6 and C.I. Pigment Violet 23 is preferable.

Ratio by mass of the blue pigment and the violet pigment is preferably 100:5 to 100:150, and more preferably 100:20 to 100:100.

As a pigment for a black matrix, carbon, titanium black, iron oxide or titanium oxide may be used independently, or in a mixed form, wherein combination of carbon and titanium black is preferable.

Ratio by mass of carbon and titanium black is preferably 100:0 to 100:60.

<Pigment Dispersed Composition>

When the colored photo-sensitive composition of this invention is prepared, it is preferable to preliminarily disperse the pigment in the form of pigment dispersed composition.

The pigment dispersed composition is obtainable by dispersing (A) the acid-decomposable resin, (B) the pigment, and (E) a solvent. Other component, such as pigment derivative, may optionally be used for the the pigment dispersed composition.

(A) The acid-decomposable resin may be added when the pigment is dispersed, or may be added later to the pigment dispersion.

<<Preparation of Pigment Dispersed Composition>>

While the method for preparing the pigment dispersed composition in this invention is not specifically limited, (A) the acid-decomposable resin, (B) the pigment, and (E) the solvent may typically be dispersed in a vertical or horizontal-type sand grinder, pin mill, slit mill, ultrasonic disperser or the like, using 0.01 to 1-mm bead made of glass, zirconia or the like.

Bead dispersion may also be preceded by kneading, while applying a strong shearing force using a double roll mill, three-roll mill, ball mill, trommel, disper, kneader, co-kneader, homogenizer, blender, single-screw or double-screw extruder.

Time of kneading or dispersion is preferably, for example, 2 hours or longer, but not specifically limited.

Details of kneading and dispersion may be referred to description in T. C. Patton, "Paint Flow and Pigment Dispersion" (1964, published by John Wiley and Sons), for example.

<<Pigment Concentration>>

Ratio of pigment in the pigment dispersed composition, relative to the total solids (mass) of the composition, is 20% by mass or more, more preferably 40% by mass or more, furthermore preferably 60% by mass or more, and particularly 75% by mass or more. With the ratio of pigment controlled in these ranges, a sufficient color density and color characteristic may be ensured. While the upper limit of the content of pigment in the pigment dispersed composition is not specifically limited, it is preferably 95% by mass or less, and more preferably 80% by mass or less.

<<Dispersant>>

The pigment dispersed composition may further contain a dispersant. By containing the dispersant, the dispersibility of pigment will be improved.

The dispersant is suitably selectable from, for example, known pigment dispersants or surfactants.

More specifically, a variety of compounds may be used, which are exemplified by cationic surfactants such as organosiloxane polymer KP341 (from Shin-Etsu Chemical Co., Ltd.), (meth)acrylic (co)polymer Polyflow No. 75, No. 90 and No. 95 (from Kyoeisha Chemical Co., Ltd.), and W001 (from Yusho Co., Ltd.); nonionic surfactants such as polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, and sorbitan fatty acid ester; anionic surfactant such as W004, W005, W017 (from Yusho Co., Ltd.); polymer dispersant such as EFKA-46, EFKA-47, EFKA-47EA, EFKA polymer 100, EFKA polymer 400, EFKA polymer 401, EFKA polymer 450 (all from CIBA Specialty Chemicals), Disperse Aid 6, Disperse Aid 8, Disperse Aid 15, and Disperse Aid 9100 (all from San Nopco Ltd.); various Solsperse dispersants such as Solsperse 3000, 5000, 9000, 12000, 13240, 13940, 17000, 24000, 26000 and 28000 (from Nippon Lubrizol Corp.); and Adeka Pluronic L31, F38, L42, L44, L61, L64, F68, L72, P95, F77, P84, F87, P94, L101, P103, F108, L121, P-123 (from Adeka Corporation), Isonet S-20 (from Sanyo Chemical Industries, Ltd.), and Disperbyk 101, 103, 106, 108, 109, 111, 112, 116, 130, 140, 142, 162, 163, 164, 166, 167, 170, 171, 174, 176, 180, 182, 2000, 2001, 2050, 2150 (from BYK-Chemie GmbH). Besides them, also exemplified are oligomer or polymer having a polar group at the molecular terminal or side chain, such as acrylic copolymer.

The total content of the dispersion resin in the pigment dispersed composition, relative to the total mass of pigment, is preferably 1 to 100% by mass, and more preferably 3 to 70% by mass.

<Pigment Derivative>

The pigment dispersion liquid in this invention may further contain a pigment derivative.

The pigment derivative preferably has a structure obtainable by replacing a part of organic pigment, anthraquinones or acrydones, with an acidic group, basic group or phthalimidomethyl group. The organic pigment composing the pigment derivative is exemplified by diketopyrrolopyrrole-base pigment; azo-base pigments such as azo, disazo, and polyazo pigments; phthalocyanine-base pigments such as copper phthalocyanine, halogenated copper phthalocyanine, and metal-free phthalocyanine; anthraquinone-base pigments such as aminoanthraquinone, diamino dianthraquinone, anthrapyrimidine, flavanthrone, anthanthrone, indanethrone, pyranthrone, and violanthrone; and quinacridone-base pigment, dioxazine-base pigment, perinone-base pigment, perylene-base pigment, thioindigo-base pigment, isoindoline-base pigment, isoindolinone-base pigment, quinophthalone-base pigment, threne-base pigment, and metal complex-base pigment.

The acidic group possessed by the pigment derivative is preferably sulfonic acid group, carboxylic acid group and quaternary ammonium salt of them. The basic group possessed by the pigment derivative is preferably amino group, and most preferably tertiary amino group.

While the amount of consumption of the pigment derivative is not specifically limited, it is preferably 5 to 50% by mass relative to the pigment, and more preferably 10 to 30% by mass.

<<Solvent>>

The solvent in the pigment dispersed composition is exemplified by, but not specifically limited to, propylene glycol monomethyl ether acetate (PGMEA), 1-methoxy-2-propyl acetate, 1-methoxy-2-propanol, ethylene glycol monomethyl ether, diethylene glycol monomethyl ether, ethyl acetate, butyl acetate, ethyl lactate, acetone, methyl ethyl ketone, methyl isobutyl ketone, cyclohexanone, n-propanol, 2-propanol, n-butanol, cyclohexanol, ethylene glycol, diethylene glycol, toluene, and xylene.

The content of the solvent in the pigment dispersed composition may arbitrarily be selected depending on, for example, applications of the pigment dispersed composition. When the pigment dispersed composition is used for preparing the colored photo-sensitive composition described later, the content is controlled so that the concentration of solids, including the pigment and the pigment dispersant, falls in the range from 5 to 50% by mass, from the viewpoint of handleability.

<(C) Compound Producing Acid Upon Irradiated by Active Light>

The composition of this invention contains (C) the compound which produces an acid upon irradiated by active light or radial ray (also referred to as (C) photo-acid generator, hereinafter). (C) The photo-acid generator is preferably a compound which produces an acid in response to active light of 300 nm or longer, and preferably 300 to 450 nm, but is not limited to the structure. Even a photo-acid generator, which is not directly sensitive to the active light of 300 nm or longer, but can produce an acid when combined with a sensitizer in response to the active light or radial ray of 300 nm or longer, may suitably be used in combination with such sensitizer. (C) The photo-acid generator is preferably a compound capable of producing an organic acid such as onium salt, sulfonic acid, bis(alkylsulfonyl)imide, or tris(alkylsulfonyl)methide acid. (C) The photo-acid generator is also preferably be trichloromethyl-s-triazines, sulfonium salt or iodonium, quaternary ammonium salts, diazomethane compound, imide sulfonate compound, and oxime sulfonate compound.

Among (C) these photo-acid generators, tris(alkylsulfonyl)methide is preferable.

More specifically, (C) the photo-acid generator is exemplified by the compounds represented by the formulae (ZI), (ZII), (ZIII) below.

[Chemical Formula 18]

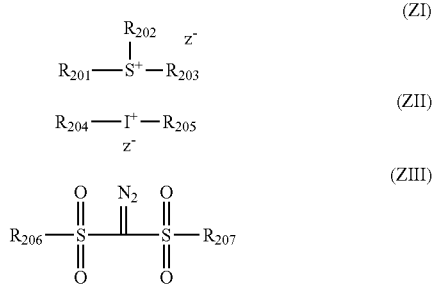

In the formula (ZI), each of $R_{201}$, $R_{202}$ and $R_{203}$ independently represents an organic group.

Each organic group represented by $R_{201}$, $R_{202}$ or $R_{203}$ generally has 1 to 30 carbon atoms, and preferably 1 to 20 carbon atoms.

Any two of $R_{201}$ to $R_{203}$ may combine to form a cyclic structure, and the ring may have therein an oxygen atom, sulfur atom, ester bond, amide bond or carbonyl group. The group which may be formed by any two of $R_{201}$ to $R_{203}$ bound to each other is exemplified by alkylene group (for example, butylene group, and pentylene group).

$Z^-$ represents a non-nucleophilic anion (anion with only a very low ability of inducing nucleophilic reaction).

The organic group represented by $R_{201}$, $R_{202}$ and $R_{203}$ is exemplified by aryl group, alkyl group and cycloalkyl group.

At least one of $R_{201}$, $R_{202}$ and $R_{203}$ is preferably an aryl group, wherein it is more preferable that all three of them are aryl groups. The aryl group may be not only phenyl group and naphthyl group, but also may be heteroaryl group such as indole residue, and pyrrole residue.

The alkyl group and cycloalkyl group represented by $R_{201}$ to $R_{203}$ are preferably exemplified by straight chain-like or branched alkyl group having 1 to 10 carbon atoms, and cyclic alkyl group having 3 to 10 carbon atoms. The straight chain-like or branched alkyl group is more preferably exemplified by methyl group, ethyl group, n-propyl group, i-propyl group, and n-butyl group. The cyclic alkyl group is more preferably exemplified by cyclopropyl group, cyclobutyl group, cyclopentyl group, cyclohexyl group, and cycloheptyl group.

These groups may have an additional substituent. The substituent is exemplified by nitro group, halogen atom such as fluorine atom, carboxyl group, hydroxy group, amino group, cyano group, alkoxy group (preferably having 1 to 15 carbon atoms), cyclic alkyl group (preferably having 3 to 15 carbon atoms), aryl group (preferably having 6 to 14 carbon atoms), alkoxycarbonyl group (preferably having 2 to 7 carbon atoms), acyl group (preferably having 2 to 12 carbon atoms), and alkoxycarbonyloxy group (preferably having 2 to 7 carbon atoms), but not limited thereto.

The non-nucleophilic anion is exemplified by sulfonate anion (aliphatic sulfonate anion, aromatic sulfonate anion, camphor sulfonate anion, etc.), carboxylate anion (aliphatic carboxylate anion, aromatic carboxylate anion, aralkyl carboxylate anion, etc.), sulfonylimide anion, bis(alkylsulfonyl)imide anion, and tris(alkylsulfonyl)methide anion.

The aliphatic moiety of each of the aliphatic sulfonate anion and aliphatic carboxylate anion may be anyone of straight chain-like, branched, and cyclic alkyl groups, and is preferably exemplified by straight chain-like or branched alkyl group having 1 to 30 carbon atoms, and cyclic alkyl group having 3 to 30 carbon atoms.

The aromatic group in aromatic sulfonate anion and aromatic carboxylate anion is preferably exemplified by aryl group having 6 to 14 carbon atoms, such as phenyl group, tolyl group and naphthyl group.

The above-described straight chain-like, branched or cyclic alkyl group, and, aryl group may have a substituent. Specific example of the substituent include nitro group, halogen atom such as fluorine atom, carboxyl group, hydroxy group, amino group, cyano group, alkoxy group (preferably having 1 to 15 carbon atoms), cyclic alkyl group (preferably having 3 to 15 carbon atoms), aryl group (preferably having 6 to 14 carbon atoms), alkoxycarbonyl group (preferably having 2 to 7 carbon atoms), acyl group (preferably having 2 to 12 carbon atoms), alkoxycarbonyloxy group (preferably having 2 to 7 carbon atoms), alkylthio group (preferably having 1 to 15 carbon atoms), alkylsulfonyl group (preferably having 1 to 15 carbon atoms), alkyliminosulfonyl group (preferably having 2 to 15 carbon atoms), aryloxysulfonyl group (preferably having 6 to 20 carbon atoms), alkylaryloxysulfonyl group (preferably having 7 to 20 carbon atoms), cycloalkylaryloxysulfonyl group (preferably having 10 to 20 carbon atoms), alkyloxyalkyloxy group (preferably having 5 to 20 carbon atoms), and cycloalkylalkyloxyalkyloxy group (preferably having 8 to 20 carbon atoms).

The aralkyl group in the aralkyl carboxylate anion is preferably exemplified by aralkyl group having 6 to 12 carbon atoms, such as benzyl group, phenetyl group, naphthylmethyl group, naphthylethyl group, and naphthylbutyl group.

The sulfonylimide anion is exemplified by saccharin anion.

The alkyl group in the bis(alkylsulfonyl)imide anion and the tris(alkylsulfonyl)methide anion is preferably an alkyl group having 1 to 5 carbon atoms. Substituent for these alkyl groups is exemplified by halogen atom, halogenated alkyl group, alkoxy group, alkylthio group, alkyloxy sulfonyl group, aryloxysulfonyl group, and cycloalkylaryloxysulfonyl group, wherein fluorine atom or fluorinated alkyl group is preferable.

The alkyl groups in the bis(alkylsulfonyl)imide anion may mutually combine to form a cyclic structure. This enhances the acid strength.

Particularly preferable non-nucleophilic anion is an aliphatic sulfonate anion, having in the aliphatic moiety thereof, straight chain-like or branched alkyl group having 1 to 30 carbon atoms, wherein it is preferable that the alkyl group is fully substituted by fluorine atoms. More specifically, $C_3F_7SO^{3-}$, $C_4F_9SO^{3-}$ and $C_5F_9SO^{3-}$, for example, are preferable.

In the formulae (ZII), (ZIII), each of $R^{204}$ to $R^{207}$ independently represents an aryl group, or, straight chain-like, branched or cyclic alkyl group.

The aryl group, and, straight chain-like, branched or cyclic alkyl group represented by $R^{204}$ to $R^{207}$ are synonymous to $R^{201}$ to $R^{203}$ of the compound (ZI), wherein the same will apply also to the preferable ranges.

The aryl group, and, straight chain-like, branched or cyclic alkyl group represented by $R^{204}$ to $R^{207}$ may have a substituent. The substituent is synonymous to $R^{201}$ to $R^{203}$ of the compound (ZI), wherein the same will apply also to the preferable ranges.

$Z^-$ represents a non-nucleophilic anion, and is synonymous to $Z^-$ in the formula (ZI), wherein the same will apply also to the preferable ranges.

Specific examples of (C) the photo-acid generator are referred to compounds described in paragraphs [0149] to

[0151], and paragraphs [0170] and [0171] of JP-A-2012-137686, and paragraphs [0243] to [0247] of JP-A-2012-208447, the contents of which are incorporated into this specification.

(C) The photo-acid generator may also be trichloromethyl-s-triazines, sulfonium salt or iodonium salt, quaternary ammonium salts, diazomethane compound, imide sulfonate compound, or, oxime sulfonate compound. Among them, also oxime sulfonate compound is preferable from the viewpoint of insulating performance. Specific examples may be referred to compounds described in paragraphs [0083] to [0088] of JP-A-2011-221494, the contents of which are incorporated into this specification.

The oxime sulfonate compound, or, compound having an oxime sulfonate structure is preferably exemplified by a compound represented by the formula (B1-1) below.

[Chemical Formula 19]

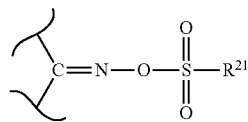

Formula (B1-1)

(In the formula (B1-1), $R^{21}$ represents an alkyl group or aryl group. The wavy lines indicate that the portions bounds to other groups.)

All of these groups may be substituted, and the alkyl group represented by $R^{21}$ may be straight chain-like, branched or cyclic. Acceptable substituents will be explained below.

The alkyl group represented by $R^{21}$ is preferably a straight chain-like or branched alkyl group having 1 to 10 carbon atoms. The alkyl group represented by $R^{21}$ may be substituted by a halogen atom, aryl group having 6 to 11 carbon atoms, alkoxy group having 1 to 10 carbon atoms, or, cycloalkyl group (including bridged cycloalkyl group such as 7,7-dimethyl-2-oxonorbornyl group, preferably bicycloalkyl group).

The aryl group represented by $R^{21}$ is preferably aryl group having 6 to 11 carbon atoms, and more preferably phenyl group or naphthyl group. The aryl group represented by $R^{21}$ may be substituted by a lower alkyl group, alkoxy group or a halogen atom.

Specific examples of the compound represented by the formula (B1-1), and specific examples of preferred oxime sulfonate compound may be referred to the description of paragraphs [0080] to [0082] of JP-A-2012-163937, the contents of which are incorporated into this specification.

(C) These photo-acid generators may be used independently, or may be used in the form of mixture of two or more species.

The content of (C) the photo-acid generator in the photo-sensitive composition of this invention is preferably 1 to 30% by mass, relative to the total solids in the photo-sensitive composition of this invention, more preferably 2 to 20% by mass, and furthermore preferably 2 to 10% by mass.

<(E) Solvent>

The colored photo-sensitive composition of this invention contains (E) the solvent.

(E) The solvent is exemplified by those selected from the organic solvents enumerated below, and is selectable taking solubility of the individual components contained in the pigment dispersion liquid, and coatability of the colored photo-sensitive composition when used therefor, into consideration. While the solvent is not specifically limited in principle, it is preferably selected taking safety into account.

Specific examples of the solvent include esters such as ethyl acetate, n-butyl acetate, isobutyl acetate, amyl formate, isoamyl acetate, butyl propionate, isopropyl butyrate, ethyl butyrate, butyl butyrate, methyl oxyacetate, oxyethyl acetate, oxybutyl acetate, methyl methoxyacetate, ethyl methoxyacetate, butyl methoxyacetate, methyl ethoxyacetate, ethyl ethoxyacetate, methyl 3-oxypropionate, ethyl 3-oxypropionate, methyl 3-methoxypropionate, ethyl 3-methoxypropionate, methyl 3-ethoxypropionate, ethyl 3-ethoxypropionate, methyl 2-oxypropionate, ethyl 2-oxypropionate, propyl 2-oxypropionate, methyl 2-methoxypropionate, ethyl 2-methoxypropionate, propyl 2-methoxypropionate, methyl 2-ethoxypropionate, ethyl 2-ethoxypropionate, methyl 2-oxy-2-methylpropionate, ethyl 2-oxy-2-methylpropionate, methyl 2-methoxy-2-methylpropionate, ethyl 2-ethoxy-2-methylpropionate, methyl pyruvate, ethyl pyruvate, propyl pyruvate, methyl acetoacetate, ethyl acetoacetate, methyl 2-oxobutyrate, and ethyl 2-oxobutyrate;

ethers such as diethylene glycol dimethyl ether, tetrahydrofuran, ethylene glycol monomethyl ether, ethylene glycol monomethyl ether, methyl cellosolve acetate (ethylene glycol monomethyl ether acetate), ethyl cellosolve acetate (ethylene glycol monoethyl ether acetate), diethylene glycol monomethyl ether, diethylene glycol monoethyl ether, diethylene glycol monobutyl ether, diethylene glycol monoethyl ether acetate, diethylene glycol monobutyl ether acetate, propylene glycol methyl ether, propylene glycol monomethyl ether acetate, propylene glycol ethyl ether acetate, and propylene glycol propyl ether acetate; ketones such as methyl ethyl ketone, cyclohexanone, 2-heptanone, and 3-heptanone; and aromatic hydrocarbons such as toluene and xylene.

Among them, more preferable examples include methyl 3-ethoxypropionate, ethyl 3-ethoxypropionate, ethylcellosolve acetate, ethyl lactate, diethylene glycol dimethyl ether, butyl acetate, methyl 3-methoxypropionate, 2-heptanone, cyclohexanone, diethylene glycol monoethyl ether acetate, diethylene glycol monobutyl ether acetate, propylene glycol methyl ether, and propylene glycol monomethyl ether acetate (PGMEA).

The content of (E) the solvent in the colored photo-sensitive composition of this invention is preferably 50 to 95% by mass, more preferably 60 to 95% by mass, and most preferably 70 to 90% by mass. The content of solvent controlled in these ranges is advantageous in terms of suppressing deposition of foreign matters.

<Other Components>

<<Dye>>

The composition of this invention may additionally contain a dye.

The dye is not specifically limited, and may be any arbitrary dye having been used for color filter. Examples of the dye include those of pyrazole azo-base, anilinoazo-base, triphenylmethane-base, anthraquinone-base, anthrapyridone-base, benzylidene-base, oxonol-base, pyrazolotriazole azo-base, pyridone azo-base, cyanine-base, phenothiazine-base, pyrrolopyrazole azomethine-base, xanthene-base, phthalocyanine-base, benzopyran-base, indigo-base, pyrromethene-base, and methine-base. Also multimer of these dyes may be used.

From the viewpoint of completely removing the binder and/or dye in the unexposed portion by development using water or alkali solution, acidic dye and/or derivative thereof may be used in a successful manner.

Also direct dye, basic dye, mordant dye, acidic mordant dye, azoic dye, disperse dye, oil color, food color, and/or derivatives of them are advantageous for use.

The dye suitably used may be referred to those described, for example, in JP-A-2012-181512, JP-A-S64-90403, JP-A-S64-91102, JP-A-H01-94301, JP-A-H06-11614, Japanese Patent No. 2592207, JP-A-H05-333207, JP-A-H06-35183, JP-A-H06-51115, JP-A-H06-194828, JP-A-H08-211599, JP-A-H04-249549, JP-A-H010-123316, JP-A-H11-302283, JP-A-H07-286107, JP-A-2001-4823, JP-A-H08-15522, JP-A-H08-29771, JP-A-H08-146215, JP-A-H11-343437, JP-A-H08-62416, JP-A-2002-14220, JP-A-2002-14221, JP-A-2002-14222, JP-A-2002-14223, JP-A-H08-302224, JP-A-H08-73758, JP-A-H08-179120, JP-A-H08-151531, the contents of which are incorporated into this specification.

The content of the dye in the colored photo-sensitive composition of this invention is preferably 0 to 50% by mass, more preferably 0 to 30% by mass, furthermore preferably 0 to 10% by mass, and particularly 0% by mass.

When the pigment and the dye are used in combination, the total content of the pigment and the dye is preferably 60% by mass or more relative to the total solids of the colored photo-sensitive composition of this invention.

<<Surfactant>>

The composition of this invention may be added with a variety of surfactants, from the viewpoint of improving coatability. The surfactant suitably used include a variety of surfactants such as fluorine-containing surfactant, nonionic surfactant, cationic surfactant, anionic surfactant, and silicone-base surfactant.

In particular, by containing the fluorine-containing surfactant, the composition of this invention will be improved in liquid characteristic (fluidity, in particular) when prepared in the form of coating liquid, and will therefore further improve uniformity in the thickness of coating and effect of liquid saving.

More specifically, when the coating liquid, applied with the colored photo-sensitive composition containing the fluorine-containing surfactant, is used for forming a film, the coating liquid will be improved in the wettability on the target surface by virtue of a reduced interfacial tension between the target surface and the coating liquid, and will therefore be improved in the coatability onto the target surface. This is advantageous since only a small amount of liquid can produce a thin film having a uniform thickness of several micrometers or around, causing only a small variation in thickness.

Fluorine content in the fluorine-containing surfactant is preferably 3% by mass to 40% by mass, more preferably 5% by mass to 30% by mass, and particularly 7% by mass to 25% by mass. With the fluorine content controlled in these ranges, the fluorine-containing surfactant will be effective in terms of uniformity of thickness of the coated film, and effect of liquid saving, and also in terms of solubility in the colored photo-sensitive composition.

The fluorine-containing surfactant is exemplified by Megafac F171, ditto F172, ditto F173, ditto F176, ditto F177, ditto F141, ditto F142, ditto F143, ditto F144, ditto R30, ditto F437, ditto F475, ditto F479, ditto F482, ditto F554, ditto F780, ditto F781 (all from DIC Corporation); Fluorad FC430, ditto FC431, ditto FC171 (from Sumitomo 3M, Ltd.); and Surflon S-382, ditto SC-101, ditto SC-103, ditto SC-104, ditto SC-105, ditto SC1068, ditto SC-381, ditto SC-383, ditto 5393, ditto KH-40 (all from Asahi Glass Co., Ltd.).

The nonionic surfactant is specifically exemplified by those described, for example, in paragraph [0553] of JP-A-2012-208494 (paragraph [0679] of correspondent United States Patent No. 2012/0235099), the contents of which are incorporated into this specification.

The cationic surfactant is specifically exemplified by those described in paragraph [0554] of JP-A-2012-208494 (paragraph [0680] of correspondent United States Patent No. 2012/0235099), the contents of which are incorporated into this specification.

The anionic surfactant is specifically exemplified by W004, W005 and W017 (from Yusho Co., Ltd.).

The silicone-base surfactant is exemplified by those described in paragraph [0556] of JP-A-2012-208494 (paragraph [0682] of correspondent United States Patent No. 2012/0235099), the contents of which are incorporated into this specification.

Only a single species of surfactant may be used, or two or more species of them may be used in combination.

The amount of addition of the surfactant is preferably 0.001% by mass to 2.0% by mass, relative to the total mass of the colored photo-sensitive composition, and more preferably 0.005% by mass to 1.0% by mass.

<<Organic Amino Compound>>

The composition of this invention may additionally contain an organic amino compound. The organic amino compound is preferably aliphatic amine or phenyl group-containing amine, having one or more amino groups in the molecule, and is more preferably phenyl group-containing amine.

The aliphatic amine may be referred, for example, to the description in paragraphs [0120] to [0123] of JP-A-2010-49161, the contents of which are incorporated into this specification.

The phenyl group-containing amine is exemplified by a compound having an amino group directly bound to a phenyl group, and a compound having an amino group bound, via a divalent carbon chain, to a phenyl group.

The phenyl group-containing amine is exemplified by aromatic amines such as aniline, o-methylaniline, m-methylaniline, p-methylaniline, p-ethylaniline, 1-naphthylamine, 2-naphthylamine, N,N-dimethylaniline, N,N-diethylaniline, and p-methyl-N,N-dimethylaniline; aminobenzyl alcohols such as o-aminobenzyl alcohol, m-aminobenzyl alcohol, p-aminobenzyl alcohol, p-dimethylaminobenzyl alcohol, and p-diethylaminobenzyl alcohol; aminophenols such as o-aminophenol, m-aminophenol, p-aminophenol, p-dimethylaminophenol, and p-diethylaminophenol; and aminobenzoic acids such as m-aminobenzoic acid, p-aminobenzoic acid, p-dimethylaminobenzoic acid, and p-diethylaminobenzoic acid.

Only a single species of the organic amino compound may be used, or two or more species of them may be used in a mixed manner.

The amount of addition of the organic amino compound in the photo-sensitive composition of this invention is preferably 0.001 to 1% by mass, relative to the total solids in the photo-sensitive composition of this invention, and more preferably 0.005 to 0.5% by mass.

The composition of this invention may optionally contain other components other than those described above. These components may be referred, for example, to the description in paragraphs [0187] to [0200] of JP-A-2010-85452, the contents of which are incorporated into this specification.

[Color Filter and Method for Manufacturing the Same]

Next, a color filter of this invention, and a method for manufacturing the same will be explained.

The color filter of this invention characteristically has, over a support, a colored pattern formed by using the colored photo-sensitive composition of this invention. The color filter of this invention will be detailed in conjunction with the method for manufacturing the same (method for manufacturing the color filter of this invention).

The method for manufacturing a color filter of this invention includes a colored layer forming step, forming a colored layer by coating, over a support, the colored photo-sensitive composition of this invention; an exposure step, exposing the colored layer through a mask; and a developing step, forming a colored pattern by developing the exposed colored layer.

The individual steps of the method for manufacturing a color filter of this invention will be explained below.

<Colored Layer Forming Step>

In the colored layer forming step, the colored photo-sensitive composition of this invention is coated over the support, to thereby form the colored layer composed of the colored photo-sensitive composition.

The support is exemplified by alkali-free glass substrate typically used for liquid crystal display device, soda glass substrate, Pyrex (registered trademark) glass substrate, quartz glass substrate, and any of these substrates having a transparent electro-conductive film deposited thereon; and photoelectric conversion element substrate used typically for solid-state imaging device, such as silicon substrate and complementary metal oxide semiconductor (CMOS) substrate. Some of these substrates may have formed thereon a black stripe for isolating the individual pixels.

These supports may optionally have formed thereon an under coat layer for the purposes of improving adhesiveness with the upper layer, preventing material diffusion, or planarizing the surface of the substrate.

Method for coating the colored photo-sensitive composition of this invention onto the support is selectable from a variety of coating methods which include slit coating, ink jet process, spin coating, casting, roll coating, and screen printing, wherein slit coating and spin coating are more preferable.

The thickness of the colored photo-sensitive composition immediately after being coated is preferably 0.1 to 10 µm from the viewpoints of uniformity of thickness of the coated film, and easiness of drying of solvent for coating, more preferably 0.2 to 5 µm, and furthermore preferably 0.2 to 3 µm.

The colored layer (colored photo-sensitive composition layer) coated over the substrate may be dried (prebaked) using a hot plate or an over, at 50° C. to 140° C. for 10 to 300 seconds.

The thickness of the colored layer coated over the substrate, that is, the thickness of the coated film of the colored photo-sensitive composition after dried (also referred to as "dry thickness", hereinafter for convenience), when intended for use as a color filter for LCD, is preferably 0.1 µm or thicker and thinner than 2.0 µm, from the viewpoints of enabling thinning of LCD, and ensuring a proper color density, and is more preferably 0.2 to 3.0 µm.

Meanwhile, the thickness of the colored layer, when intended for use as a color filter for solid-state imaging device, is preferably 0.05 µm or thicker and thinner than 1.0 µm, from the viewpoint of ensuring a proper color density, and reducing nonconformities such that obliquely incident light cannot reach the light receiving part, or such that the light condensing rate largely differs between the periphery and the center of device. The thickness is more preferably 0.1 to 0.8 µm, and particularly 0.2 to 0.7 µm.

<Exposure Step>

In the exposure step, the colored layer (photo-sensitive composition layer) formed in the colored layer forming step is exposed to light through a mask having a predetermined mask pattern.

In the exposure in this step, the pattern-wise exposure of the coated film may be carried out through a predetermined mask pattern, so as to selectively cure the exposed portion of the coated film. As the radial ray usable here for the exposure, it is particularly preferable to use ultraviolet radiation such as g-line, h-line, or i-line. The luminous intensity is preferably 5 to 1500 mJ/cm$^2$, more preferably 10 to 1000 mJ/cm$^2$, and most preferably 10 to 500 mJ/cm$^2$.

For the color filter of this invention intended for use in liquid crystal display element, the luminous intensity is preferably 5 to 200 mJ/cm$^2$ within the above-described range, more preferably 10 to 150 mJ/cm$^2$, and furthermore preferably 10 to 100 mJ/cm$^2$. For the color filter of this invention intended for use in solid-state imaging device, the luminous intensity is preferably 30 to 1500 mJ/cm$^2$ within the above-described range, more preferably 50 to 1000 mJ/cm$^2$, and furthermore preferably 80 to 500 mJ/cm$^2$.

<Developing Step>

In the succeeding step of alkali development (developing step), a portion remained unexposed in the exposure step is dissolved into an aqueous alkali solution, to leave only the photo-cured portion. The development using the developing solution is repeated for the individual colors (three or four colors) to form a pixel-patterned film. The developing solution is preferably an organic alkali developing solution unlikely to damage the underlying circuit or the like. The developing temperature is generally 20 to 30° C., and the developing time is 20 to 90 seconds.

Alkali reagent used for the developing solution is exemplified by ammonia water; organic alkali compounds such as ethylamine, diethylamine, dimethylethanolamine, tetramethylammonium hydroxide, tetraethylammonium hydroxide, choline, pyrrole, piperidine, and 1,8-diazabicyclo-[5.4.0]-7-undecene; and inorganic compounds such as sodium hydroxide, potassium hydroxide, sodium hydrogen carbonate, and potassium hydrogen carbonate. These alkali reagent are preferably used in the form of aqueous alkali solution obtainable by dilution with pure water to 0.001 to 10% by mass, and more preferably to 0.01 to 1% by mass. The development using such developing solution composed of an aqueous alkali solution is generally followed by rinsing with pure water.

Next, an excessive developing solution is rinsed off, and the product is dried.

In the method for manufacturing of this invention, the above described colored layer forming step, the exposure step, and the developing step may be followed by an optional curing step in which the thus formed colored pattern is baked (post-baking) and/or cured by exposure.

The post-baking is a heating process after the development aimed at complete curing, and is generally proceeded under heating at 100° C. to 240° C. When a glass substrate or silicon substrate is used as the substrate, the baking temperature is preferably 200° C. to 240° C. within the above described range.

The post-baking of the thus-developed coated film may be proceeded using a heating means such as hot plate, convection oven (hot air circulation oven), or high frequency heater under the condition described above, based on a continuous process or batch process.

The colored layer forming step, the exposure step, and the developing step (and optionally the curing step) described above are repeated the same number of times as the number of desired hues, to manufacture a color filter with desired hues.

While the description above has been made on the colored photo-sensitive composition of this invention mainly intended for use for forming the pixels of color filter, the composition is of course applicable to a black matrix provided around the pixels of the color filter. The black matrix may be formed in the same way as the pixels by the pattern-wise exposure, alkali development, and post-baking for accelerated curing of the film, except that a black pigment such as carbon black or titanium black is added as a colorant to the colored photo-sensitive composition of this invention.

Since the color filter of this invention is manufactured by using the colored photo-sensitive composition of this invention characterized by a high exposure sensitivity, so that the cured composition in the exposed area shows a good adhesiveness to the substrate and a good development resistance, the thus formed colored pattern tightly adheres to the substrate, and the pattern having a target cross sectional shape in a high resolution may be obtained.

The solid-state imaging device of this invention is characterized in that it has the color filter of this invention manufactured by the method for manufacturing a color filter of this invention.

More specifically, the color filter of this invention is suitably used for solid-state imaging devices such as liquid crystal display device and CCD, and is particularly suitable for high-resolution CCD and CMOS devices having a million or more pixels. The color filter of this invention is typically usable as the color filter disposed between the light receiving part of the individual pixels composing the CCD device, and the micro-lenses for condensing the light.

The liquid crystal display device and the solid-state imaging device using the color filter of this invention may be referred to the description in paragraphs [0601] to [0606] of JP-A-2012-208494 (paragraphs [0768] to [0780] of correspondent United States Patent No. 2012/0235099), the contents of which are incorporated into this specification.

EXAMPLE

This invention will further be detailed referring to Examples. All materials, amounts of use, ratios, details of processes, and procedures of processes described in Examples below may appropriately be modified without departing from the spirit of this invention. This invention is therefore not limited to the specific Examples described below.

<(A) Acid-Decomposable Resin>

(Exemplary Synthesis 1)

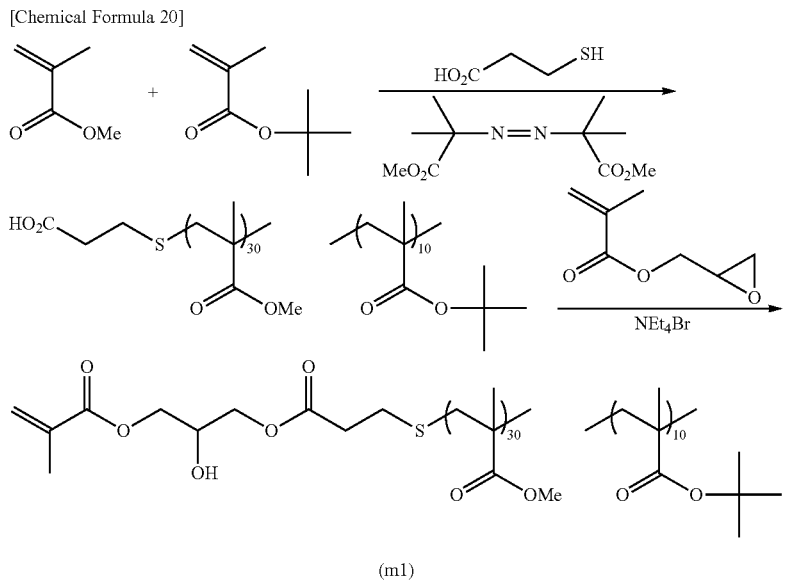

[Chemical Formula 20]

(m1)

In a three-necked flask, 339.3 g (3.39 mol) of methyl methacrylate, 160.7 g (1.13 mol) of t-butyl methacrylate, 12.0 g (0.113 mol) of 2-mercaptopropionic acid, and 1167 g of 1-methoxy-2-propanol were placed, and the content was heated under a nitrogen gas flow at 75° C. To the mixture, 2.60 g (0.113 mol) of dimethyl 2,2'-bisisobutyrate (V-601, from Wako Pure Chemical Industries, Ltd.) was added, and the content was heated for 2 hours, and further at 100° C. for 2 hours. To the mixture, 17.7 g (0.124 mol) of glycidyl methacrylate and 2.61 g (0.0124 mol) of tetraethylammonium bromide were added, and the content was heated at 100° C. for 24 hours. The content was then cooled down to room temperature, added with 1167 g of methanol, and the obtained solution was added dropwise into 5 L of water for re-precipitation. The obtained solid was dried in a fan dryer at 40° C., to obtain 501 g of macromonomer (m1). The macromonomer (m1) was found to have a weight-average molecular weight of 4,200.

(Exemplary Syntheses 2 to 10)

Macromonomers (m2) to (m10) below were synthesized by the same operations as in Exemplary Synthesis 1. In the structural formula below, "a" and "b" represent molar ratio of constitutive units.

[Chemical Formula 21]
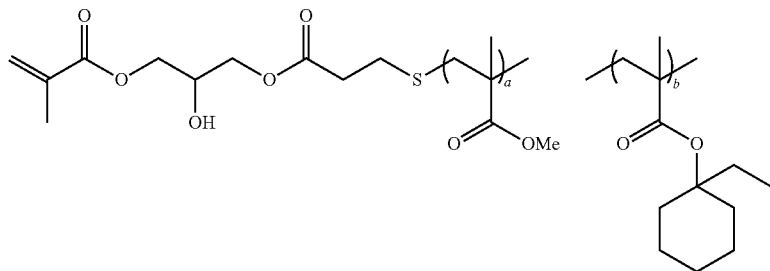
(m2) a/b = 30/10 Mw4,100
(m3) a/b = 60/20 Mw8,500
(m4) a/b = 20/5 Mw2,500
(m5) a/b = 35/5 Mw4,300
(m6) a/b = 20/20 Mw4,500
(m7)
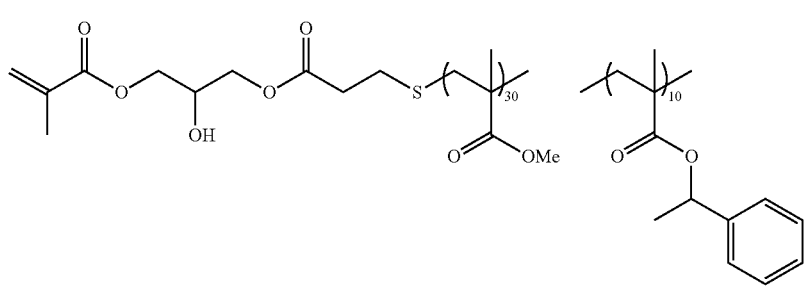
(m8)
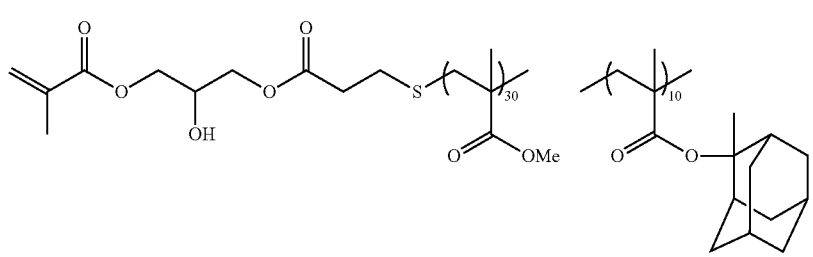
(m9)
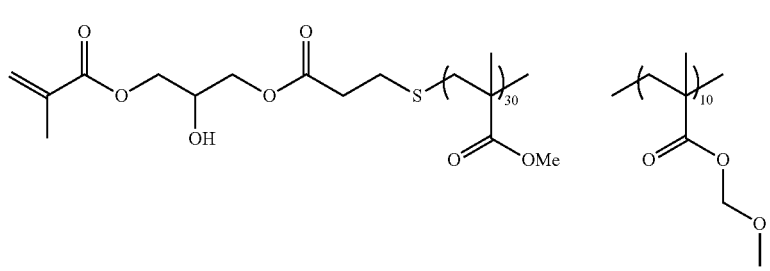
(m10)
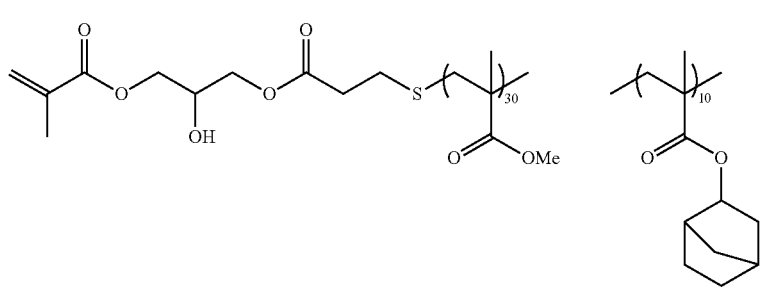

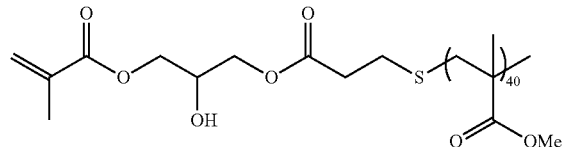

(m11)

(Exemplary Synthesis 11)
<Synthesis of Resin (J1)>

[Chemical Formula 22]

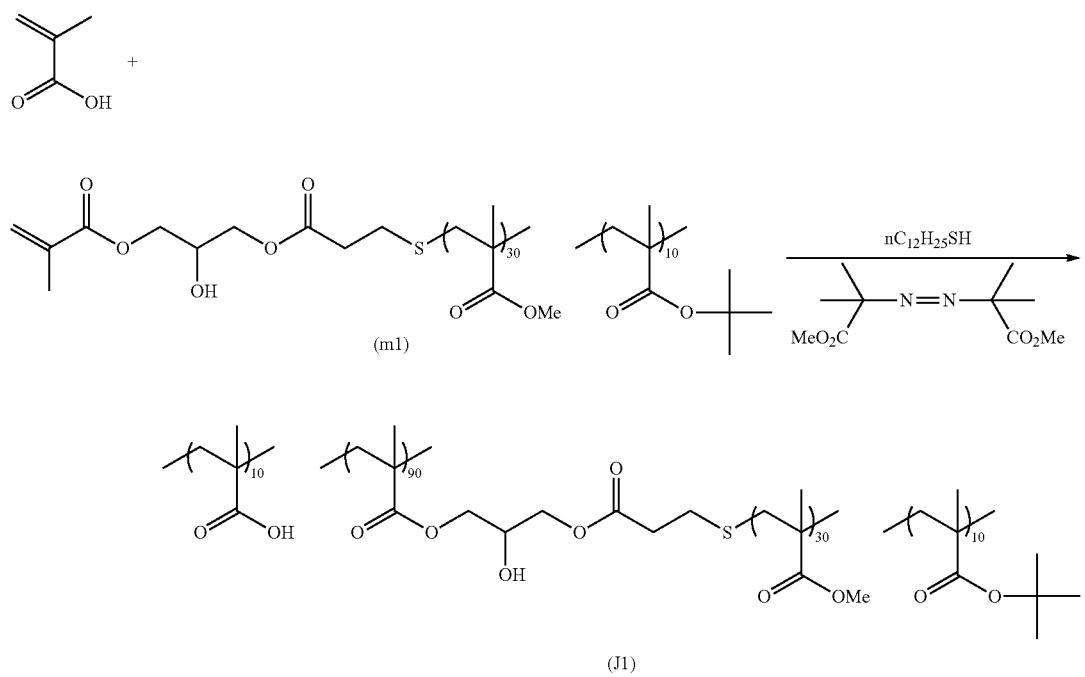

(J1)

In a three-necked flask, 10 g of methacrylic acid, 90 g of macromonomer (m1), 1.5 g of dodecylmercaptan, and 233 g of propylene glycol 1-monomethyl ether 2-acetate were placed, and the content was heated under a nitrogen gas flow at 75° C. for 1 hour. To the mixture, 0.30 g of dimethyl 2,2'-bisisobutyrate was added, and the mixture was heated for 2 hours. Thereafter, 0.30 g of dimethyl 2,2'-bisisobutyrate was added, the mixture was heated for 2 hours, and then heated at 90° C. for 2 hours, to thereby obtain a 30% by mass solution of resin (J1) in propylene glycol 1-monomethyl ether 2-acetate. The resin (J1) was found to have a weight-average molecular weight of 22,000, and an acid value of 65 mgKOH/g.

(Exemplary Syntheses 12 to 30)
<Syntheses of Resins (J2) to (J24) and Resin (B1)>

Resins (J2) to (J24) and resin (B1) were synthesized according to the compositions listed in Table below, by the same operations as in the Exemplary Synthesis 11. Each of the resins (J2) to (J24) has an acid-decomposable group, and resin (B1) does not have an acid-decomposable group. Structures of the resins (J11), (J12) and (J22) are illustrated below.

[Chemical Formula 23]

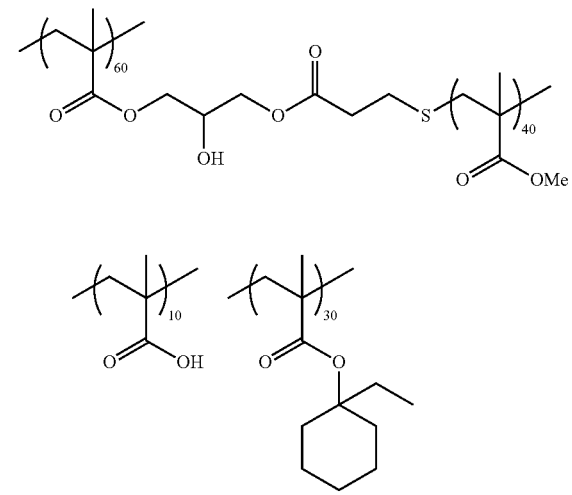

(J11)

-continued

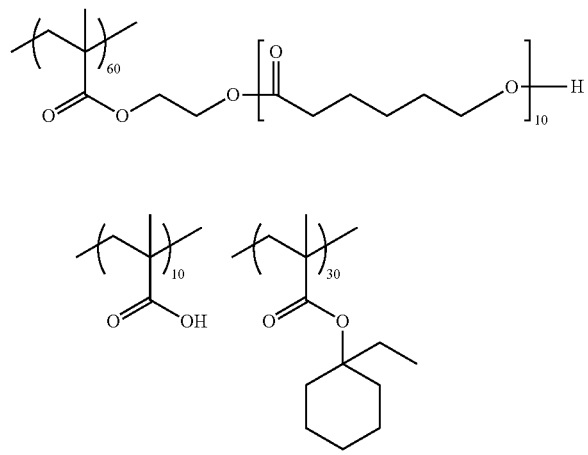
(J12)

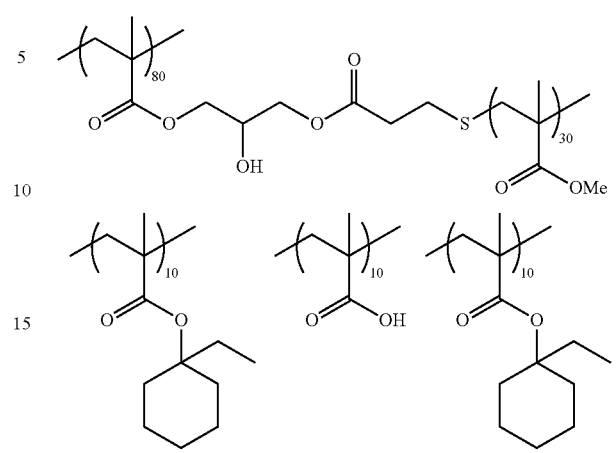
(J22)

TABLE 1

| Exemplary Synthesis | Resin | Ingredients for copolymerization 1 | | Ingredients for copolymerization 2 | | Ingredients for copolymerization 3 | | Amount to be added of dodecyl mercaptan (parts by mass) | Mw | Acid value mgKOH/g |
|---|---|---|---|---|---|---|---|---|---|---|
| | | Kind | Amount to be added (parts by mass) | Kind | Amount to be added (parts by mass) | Kind | Amount to be added (parts by mass) | | | |
| 11 | (J1) | (m1) | 90 | Methacrylic acid | 10 | — | — | 1.5 | 22000 | 65 |
| 12 | (J2) | (m2) | 90 | Methacrylic acid | 10 | — | — | 1.5 | 23000 | 63 |
| 13 | (J3) | (m3) | 90 | Methacrylic acid | 10 | — | — | 1.5 | 21000 | 65 |
| 14 | (J4) | (m4) | 90 | Methacrylic acid | 10 | — | — | 1.5 | 19000 | 66 |
| 15 | (J5) | (m5) | 90 | Methacrylic acid | 10 | — | — | 1.5 | 22000 | 64 |
| 16 | (J6) | (m6) | 90 | Methacrylic acid | 10 | — | — | 1.5 | 23000 | 66 |
| 17 | (J7) | (m7) | 90 | Methacrylic acid | 10 | — | — | 1.5 | 22000 | 65 |
| 18 | (J8) | (m8) | 90 | Methacrylic acid | 10 | — | — | 1.5 | 21000 | 63 |
| 19 | (J9) | (m9) | 90 | Methacrylic acid | 10 | — | — | 1.5 | 19000 | 64 |
| 20 | (J10) | (m10) | 90 | Methacrylic acid | 10 | — | — | 1.5 | 23000 | 65 |
| 21 | (J11) | (m11) | 60 | Methacrylic acid | 10 | Monomer 1 | 30 | 1.5 | 22000 | 68 |
| 22 | (J12) | (m12) | 50 | Methacrylic acid | 10 | Monomer 1 | 30 | 1.5 | 22000 | 62 |
| 23 | (J13) | (m2) | 60 | Monomer 2 | 40 | — | — | 1.5 | 25000 | 96 |
| 24 | (J14) | (m2) | 50 | Monomer 3 | 50 | — | — | 1.5 | 24000 | 101 |
| 25 | (J15) | (m2) | 60 | Monomer 4 | 40 | — | — | 1.5 | 23000 | 75 |
| 26 | (J16) | (m2) | 90 | Acrylic acid | 10 | — | — | 1.5 | 22000 | 78 |
| 27 | (J17) | (m2) | 95 | Methacrylic acid | 5 | — | — | 1.5 | 21000 | 34 |
| 28 | (J18) | (m2) | 85 | Methacrylic acid | 15 | — | — | 1.5 | 25000 | 90 |
| 29 | (J19) | (m2) | 80 | Methacrylic acid | 20 | — | — | 1.5 | 23000 | 124 |
| 30 | (J20) | (m2) | 90 | Methacrylic acid | 10 | — | — | 4.0 | 11000 | 67 |
| 31 | (J21) | (m2) | 90 | Methacrylic acid | 10 | — | — | 0.50 | 45000 | 66 |
| 32 | (J22) | (m2) | 80 | Methacrylic acid | 10 | Monomer 1 | 10 | 1.5 | 21000 | 66 |
| 33 | (J23) | Benzyl-methacrylic acid | 60 | Methacrylic acid | 10 | Monomer 1 | 30 | 1.5 | 19000 | 65 |
| 34 | (J24) | Methyl methacrylate | 60 | Methacrylic acid | 10 | Monomer 1 | 30 | 1.5 | 18000 | 66 |

TABLE 1-continued

| | | Ingredients for copolymerization 1 | | Ingredients for copolymerization 2 | | Ingredients for copolymerization 3 | | Amount to be added of dodecyl | | |
|---|---|---|---|---|---|---|---|---|---|---|
| Exemplary Synthesis | Resin | Kind | Amount to be added (parts by mass) | Kind | Amount to be added (parts by mass) | Kind | Amount to be added (parts by mass) | mercaptan (parts by mass) | Mw | Acid value mgKOH/g |
| 35 | (J25) | Methyl methacrylate | 70 | — | — | Monomer 1 | 30 | 1.5 | 21000 | 0 |
| 36 | (B1) | (m11) | 90 | Methacrylic acid | 10 | — | — | 1.5 | 22000 | 64 |

The abbreviations in Table stand for as follows:
(m1) to (m11): macromonomers (m1) to (m11) described above
(m12): compound shown below

[Chemical Formula 24]

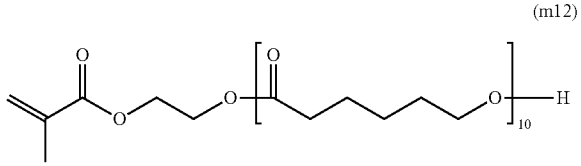

(m12)

Monomers: Compounds shown below

[Chemical Formula 25]

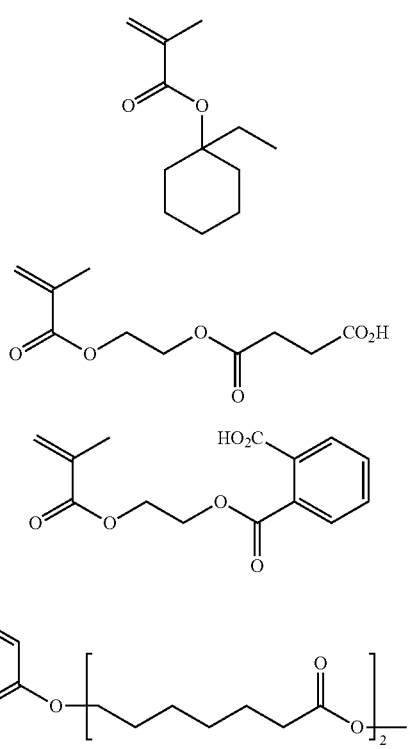

Monomer 1

Monomer 2

Monomer 3

Monomer 4

<Preparation of Pigment Dispersion>
(Exemplary Preparation 1)
A mixed liquid, which contains 30 parts by mass of C.I. Pigment Green 36 [with a secondary particle size of 60 nm (by dynamic scattering method) and 55 nm (average value calculated from 50 secondary particles observed under a TEM)], 10 parts by mass of C.I. Pigment Green 150 [with a secondary particle size of 50 nm (by dynamic scattering method), and 45 nm (average value calculated from 50 secondary particles observed under a TEM)], both as the pigment, and 83 parts by mass of resin (J1) (25 parts by mass, in terms of solid content) and 67 parts by mass of propylene glycol 1-monomethyl ether 2-acetate, was mixed and allowed to disperse in a bead mill (with zirconia bead of 0.3 mm in diameter) for 3 hours, to prepare a pigment dispersion liquid.

The pigment dispersion liquid was found to have an average primary particle size of pigment of 25 nm, when measured by the dynamic scattering method (using Microtrac Nanotrac UPA-EX150, from Nikkiso Co., Ltd., measured without diluting the pigment dispersion liquid).

<Preparation of Colored Photo-Sensitive Composition>
The pigment dispersion liquid described above was mixed under stirring according to the compositional ratio below, to thereby prepare a colored photo-sensitive composition (C1).

Pigment dispersion liquid described above: 200 parts by mass (containing 40 parts by mass of pigment, and 25 parts by mass of resin (J1))
Photo-acid generator (H1): 5.0 parts by mass
N,N-Diethylaniline: 0.01 parts by mass
Fluorine-containing surfactant (F-475, from DIC Corporation): 0.1 parts by mass
Solvent (propylene glycol 1-monomethyl ether 2-acetate): 162 parts by mass (Exemplary Preparations 2 to 26)
Colored photo-sensitive compositions (C2) to (C26) summarized in Table below were prepared in the same way as described in Exemplary Preparation 1.

(Exemplary Preparation 27)
The pigment dispersion liquid was prepared in the same way as in Exemplary Preparation 1, except that resin (J1) was replaced by resin (B1). The pigment dispersion liquid was mixed under stirring according to the compositional ratio below, to prepare colored photo-sensitive composition (C27).

Pigment dispersion liquid described above: 200 parts by mass (containing 40 parts by mass of pigment, and 25 parts by mass of resin (B1))
Photo-acid generator (H1): 5.0 parts by mass
Resin (J23): 67 parts by mass (20 parts by mass, in terms of solid content)
Solvent (propylene glycol 1-monomethyl ether 2-acetate): 95 parts by mass (Exemplary Preparations 28, 29)
Colored photo-sensitive compositions (C28), (C29) were prepared in the same way as in Exemplary Preparation 27, except that resin (J23) was replaced with resins (J24) and (J25), respectively.

(Exemplary Preparation 30)

Colored photo-sensitive composition (C30) was prepared in the same way as in Exemplary Preparation 1, except that the amount of consumption of resin (J1) was changed to 33 parts by mass (10 parts by mass, in terms of solid content).

(Exemplary Preparation 31)

A mixed liquid, which contains 30 parts by mass of C.I. Pigment Green 36 [with a secondary particle size of 60 nm (by dynamic scattering method), and 55 nm (average value calculated from 50 secondary particles observed under a TEM)], 10 parts by mass of C.I. Pigment Green 150 [with a secondary particle size of 50 nm (by dynamic scattering method), and 45 nm (average value calculated from 50 secondary particles observed under a TEM)], both as the pigment, and 33 parts by mass of resin (B1) (10 parts by mass, in terms of solid content) and 127 parts by mass of propylene glycol 1-monomethyl ether 2-acetate, was mixed and allowed to disperse in a bead mill (with zirconia bead of 0.3 mm in diameter) for 3 hours, to prepare a pigment dispersion liquid.

The pigment dispersion liquid was found to have an average primary particle size of pigment of 25 nm, when measured by dynamic scattering method (using Microtrac Nanotrac UPA-EX150, from Nikkiso Co., Ltd., measured without diluting the pigment dispersion liquid).

<Preparation of Colored Photo-Sensitive Composition>

The pigment dispersion liquid described above was mixed under stirring according to the compositional ratio below, to thereby prepare a colored photo-sensitive composition (C31).

Pigment dispersion liquid described above: 200 parts by mass (containing 40 parts by mass of pigment, and 10 parts by mass of resin (B1))
Radical polymerization initiator (Irgacure OXE01, from BASF): 2.5 parts by mass
Ethylenic unsaturated double bond-containing compound (dipentaerythritol hexaacrylate): 2.5 parts by mass
Fluorine-containing surfactant (F-475, from DIC Corporation): 0.1 parts by mass
Solvent (propylene glycol 1-monomethyl ether 2-acetate): 162 parts by mass.

TABLE 2

| Example of preparation | Composition | Pigment (the brackets show the amount to be used of pigments) | Resin dispersant | Photo-acid generator | Resin |
|---|---|---|---|---|---|
| 1 | (C1) | PG36/PY150(30:10) | (J1) | (H1) | — |
| 2 | (C2) | PG36/PY150(30:10) | (J2) | (H1) | — |
| 3 | (C3) | PG36/PY150(30:10) | (J3) | (H1) | — |
| 4 | (C4) | PG36/PY150(30:10) | (J4) | (H1) | — |
| 5 | (C5) | PG36/PY150(30:10) | (J5) | (H1) | — |
| 6 | (C6) | PG36/PY150(30:10) | (J6) | (H1) | — |
| 7 | (C7) | PG36/PY150(30:10) | (J7) | (H1) | — |
| 8 | (C8) | PG36/PY150(30:10) | (J8) | (H1) | — |
| 9 | (C9) | PG36/PY150(30:10) | (J9) | (H1) | — |
| 10 | (C10) | PG36/PY150(30:10) | (J10) | (H1) | — |
| 11 | (C11) | PG36/PY150(30:10) | (J11) | (H1) | — |
| 12 | (C12) | PG36/PY150(30:10) | (J12) | (H1) | — |
| 13 | (C13) | PG36/PY150(30:10) | (J13) | (H1) | — |
| 14 | (C14) | PG36/PY150(30:10) | (J14) | (H1) | — |
| 15 | (C15) | PG36/PY150(30:10) | (J15) | (H1) | — |
| 16 | (C16) | PG36/PY150(30:10) | (J16) | (H1) | — |
| 17 | (C17) | PG36/PY150(30:10) | (J17) | (H1) | — |
| 18 | (C18) | PG36/PY150(30:10) | (J18) | (H1) | — |
| 19 | (C19) | PG36/PY150(30:10) | (J19) | (H1) | — |
| 20 | (C20) | PG36/PY150(30:10) | (J20) | (H1) | — |
| 21 | (C21) | PG36/PY150(30:10) | (J21) | (H1) | — |
| 22 | (C22) | PG36/PY150(30:10) | (J22) | (H1) | — |
| 23 | (C23) | PG36/PY150(30:10) | (J2) | (H2) | — |
| 24 | (C24) | PG36/PY150(30:10) | (J2) | (H3) | — |
| 25 | (C25) | PB15:6/PV23(30:10) | (J2) | (H1) | — |
| 26 | (C26) | PR254/PY139(35:5) | (J2) | (H1) | — |
| 27 | (C27) | PG36/PY150(30:10) | (B1) | (H1) | (J23) |
| 28 | (C28) | PG36/PY150(30:10) | (B1) | (H1) | (J24) |
| 29 | (C29) | PG36/PY150(30:10) | (B1) | (H1) | (J25) |
| 30 | (C30) | PG36/PY150(30:10) | (J1) | (H1) | — |
| 31 | (C31) | PG36/PY150(30:10) | | | |

The abbreviations in Table stand for as follows:
PG36: C.I. Pigment Green 36
PR254: C.I. Pigment Red 254
PY139: C.I. Pigment Yellow 139
PY150: C.I. Pigment Yellow 150
PB15:6: C.I. Pigment Blue 15:6
(H1) to (H3): compounds shown below

[Chemical Formula 26]

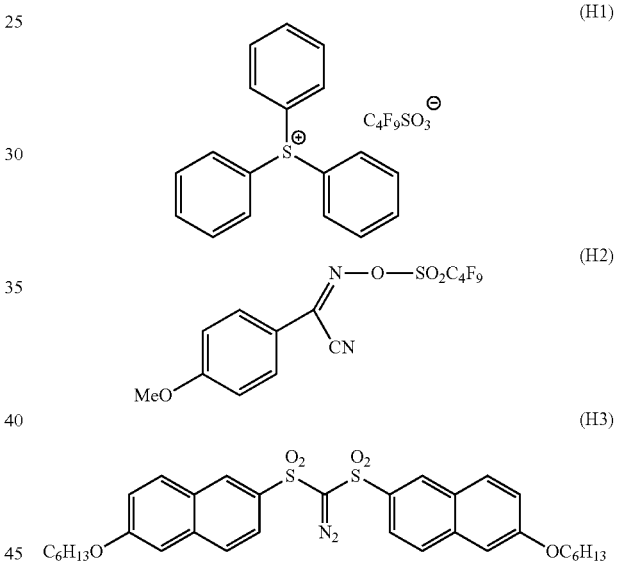

<Manufacture of Color Filter for Liquid Crystal Display Device>

The thus prepared colored photo-sensitive compositions (C1) to (C29) were used as a resist solution, coated by slit coating over a 550 mm×650 mm glass substrate under conditions summarized below, followed by vacuum drying and prebaking (100° C., 80 seconds), to thereby form a coated film of the colored photo-sensitive composition (colored photo-sensitive composition layer) over the glass substrate.

<<Conditions of Slit Coating>>

Gap width of opening at the end of coating head: 50 μm
Coating speed: 100 mm/sec
Clearance between substrate and coating head: 150 μm
Dry thickness: 1.75 μm
Coating temperature: 23° C.

<<Exposure, Development>>

The coated film of the colored photo-sensitive composition was exposed pattern-wise through a photomask having a 20 μm-wide line pattern, using LE4000A from Hitachi High-Technologies Corporation, and a 1 to 3-kW ultrahigh pressure mercury lamp at a luminous intensity of 100 mJ/cm². After the exposure, the entire surface of the coated film was covered with a 1% aqueous solution of an inorganic developing solution (trade name: CDK-1, from FUJIFILM Electronic Materials Co., Ltd.), and the work was allowed to stand still for 60 seconds.

<<Baking>>

After allowed to stand still, the developing solution was rinsed off under a shower of pure water, and the coated film having been thus exposed (cured) and developed was baked (post-baking) in an oven at 220° C. for one hour. In this way, a color filter composed of a glass substrate and a pattern of the colored photo-sensitive composition (colored layer) formed thereon, was obtained.

<<Evaluation of Performance>>

Developability and exposure sensitivity of the thus prepared colored photo-sensitive compositions were evaluated. Also contrast of the coated films of the photo-sensitive compositions (colored layers), formed over the glass substrate using the colored photo-sensitive compositions, was evaluated.

Methods of evaluation and criteria for evaluation are as described below. Results are summarized in Table below.

<<Developability>>

After developed as described above in <Exposure, Development>, 20 developed areas (unexposed areas) were observed under a SEM, and residues were counted. The lesser the residues, the better the developability.

<<Exposure Sensitivity>>

The exposure was conducted as described above in <Exposure, Development>, while varying the luminous intensity in the range from 10 to 500 mJ/cm², and the luminous intensity under which a 20 μm-wide line pattern is obtainable after the post-baking was evaluated as the exposure sensitivity. The smaller the value of luminous intensity, the higher the exposure sensitivity.

TABLE 3

| | Composition | Ratio of pigment relative to the total solid in the composition (% by mass) | Developability | Exposure Sensitivity (mJ/cm²) |
|---|---|---|---|---|
| Example 1 | (C1) | 57 | 3 | 80 |
| Example 2 | (C2) | 57 | 0 | 50 |
| Example 3 | (C3) | 57 | 0 | 50 |
| Example 4 | (C4) | 57 | 0 | 50 |
| Example 5 | (C5) | 57 | 0 | 50 |
| Example 6 | (C6) | 57 | 0 | 60 |
| Example 7 | (C7) | 57 | 6 | 120 |
| Example 8 | (C8) | 57 | 0 | 50 |
| Example 9 | (C9) | 57 | 7 | 120 |
| Example 10 | (C10) | 57 | 6 | 120 |
| Example 11 | (C11) | 57 | 7 | 120 |
| Example 12 | (C12) | 57 | 7 | 110 |
| Example 13 | (C13) | 57 | 0 | 50 |
| Example 14 | (C14) | 57 | 0 | 60 |
| Example 15 | (C15) | 57 | 0 | 50 |
| Example 16 | (C16) | 57 | 0 | 50 |
| Example 17 | (C17) | 57 | 2 | 70 |
| Example 18 | (C18) | 57 | 3 | 80 |
| Example 19 | (C19) | 57 | 7 | 120 |
| Example 20 | (C20) | 57 | 6 | 110 |
| Example 21 | (C21) | 57 | 6 | 110 |
| Example 22 | (C22) | 57 | 0 | 40 |
| Example 23 | (C23) | 57 | 3 | 60 |
| Example 24 | (C24) | 57 | 2 | 70 |
| Example 25 | (C25) | 57 | 0 | 50 |
| Example 26 | (C26) | 57 | 0 | 50 |
| Example 27 | (C27) | 57 | 12 | 120 |

TABLE 3-continued

| | Composition | Ratio of pigment relative to the total solid in the composition (% by mass) | Developability | Exposure Sensitivity (mJ/cm²) |
|---|---|---|---|---|
| Example 28 | (C28) | 50 | 13 | 140 |
| Example 29 | (C29) | 50 | 23 | 300 |
| Example 30 | (C30) | 73 | 9 | 110 |
| Comparative Example 1 | (C31) | 57 | Improper for deveplopping | — |

<Manufacture of Liquid Crystal Display Device>
<<Manufacture of Color Filter for Liquid Crystal Display Device>>

On the glass substrate manufactured in Example 2, having the green (G) colored pattern formed thereon, a red (R) colored pattern, in the foam of 20 μm-wide line pattern, was formed using the colored photo-sensitive composition (C26) for forming red (R) pattern, and again in the same way, a blue (B) chromatic colored pattern, in the form of 20 μm-wide line pattern, was formed using the colored photo-sensitive composition (C25) for forming blue (B) pattern, to thereby manufacture a color filter for liquid crystal display device, with a black matrix.

<Evaluation of Liquid Crystal Display Device>

The full-color-type color filter was provided with an ITO transparent electrode and an alignment film, and was provided with a liquid crystal display device. The colored photo-sensitive composition of this invention showed a good uniformity in the coated surface, and the liquid crystal display device showed a good image quality without non-uniformity in display.

<Manufacture of Color Filter for Solid-State Imaging Device>
<<Preparation of Resist Liquid for Forming Undercoat Layer>>

The components below were mixed and dissolved according to the composition below, to prepare a resist liquid.

Solvent (propylene glycol monomethyl ether acetate): 19.20 parts

Solvent (ethyl lactate): 36.67 parts

Alkali soluble resin: 40% PGMEA solution of benzyl methacryalte/methacrylic acid/2-hydroxyethyl methacrylate copolymer (molar ratio=60/22/18, weight-average molecular weight=15,000), 30.51 parts Ethylenic unsaturated double bond-containing compound (dipentaerythritol hexaacrylate): 12.20 parts Polymerization inhibitor (p-methoxyphenol): 0.0061 parts Fluorine-containing surfactant (F-475, from DIC Corporation): 0.83 parts Photo-polymerization initiator: trihalomethyltriazine-base, photo-polymerization initiator, 0.586 parts (TAZ-107, from Midori Kagaku Co., Ltd.)

<<Manufacture of Silicon Substrate with Undercoat Layer>>

A 6-inch silicon wafer was baked in an oven at 200° C. for 30 minutes. The resist liquid was then coated over the silicon wafer, so as to obtain a dry thickness of 1.5 μm, and was further dried in an oven at 220° C. for one hour to form an undercoat layer, to thereby obtain a silicon wafer substrate with the undercoat layer.

<Manufacture and Evaluation of Color Filter Using Colored Photo-Sensitive Composition>

<<Patterning>>

The colored photo-sensitive composition prepared as described above was coated over the undercoat layer on the silicon wafer with undercoat layer, to form the colored photo-sensitive composition layer (coated film). The coated film was then baked (prebaking) on a hot plate at 100° C. for 120 seconds, so as to obtain a dry thickness of 0.5 μm.

The coated film was then exposed using an i-line stepper FPA-3000i5+ (from Canon Inc.) at a wavelength of 365 nm, through a mask having a 1.2 μm square Bayer pattern, while varying the luminous intensity from 50 to 1200 mJ/cm². The silicon wafer substrate having the thus-exposed coated film formed thereon was placed on a horizontal rotating table of a spinning shower developer (Model DW-30, from Chemitronics Co., Ltd.), and subjected to puddle development at 23° C. for 60 seconds using a CD-2000 (from FUJIFILM Electronic Materials Co., Ltd.), to thereby form a colored pattern on the silicon wafer substrate.

The silicon wafer having the colored pattern formed thereon was then fixed on the horizontal rotating table with a vacuum chuck mechanism, and while rotating the silicon wafer substrate at 50 rpm by a rotating unit, pure water was fed in the form of shower through a spray nozzle from above the center of rotation, and then spray-dried. The size of the colored pattern was then measured under a critical dimension SEM "S-9260A" (from Hitachi High-Technologies Corporation). The luminous intensity under which a pattern size of 1.2 μm is obtainable was evaluated as the exposure sensitivity.

<Evaluation of Performance>

The exposure sensitivity and the developability of the thus prepared colored photo-sensitive compositions were evaluated as described below. Results are summarized in Table below.

<<Developability>>

After developed as described above in <Manufacture and Evaluation of Color Filter using Colored Photo-Sensitive Composition>, 20 developed areas (unexposed areas) were observed under a SEM, and residues were counted. The lesser the residues, the better the developability.

<<Exposure Sensitivity>>

The exposure was conducted while varying the luminous intensity in the range from 10 to 500 mJ/cm², and the luminous intensity under which a 1.2 μm-wide line pattern is obtainable after the post-baking was evaluated as the exposure sensitivity. The smaller the value of exposure sensitivity, the higher the exposure sensitivity.

TABLE 4

| | Composition | Ratio of pigment, relative to the total solid in the composition (% by mass) | Developability | Exposure Sensitivity (mJ/cm²) |
|---|---|---|---|---|
| Example 31 | (C1) | 57 | 5 | 200 |
| Example 32 | (C2) | 57 | 1 | 100 |
| Example 33 | (C3) | 57 | 2 | 100 |
| Example 34 | (C4) | 57 | 1 | 100 |
| Example 35 | (C5) | 57 | 2 | 100 |
| Example 36 | (C6) | 57 | 1 | 100 |
| Example 37 | (C7) | 57 | 8 | 300 |
| Example 38 | (C8) | 57 | 1 | 100 |
| Example 39 | (C9) | 57 | 9 | 300 |
| Example 40 | (C10) | 57 | 6 | 300 |
| Example 41 | (C11) | 57 | 7 | 300 |
| Example 42 | (C12) | 57 | 7 | 300 |
| Example 43 | (C13) | 57 | 1 | 100 |
| Example 44 | (C14) | 57 | 1 | 100 |
| Example 45 | (C15) | 57 | 2 | 100 |
| Example 46 | (C16) | 57 | 1 | 100 |
| Example 47 | (C17) | 57 | 2 | 100 |
| Example 48 | (C18) | 57 | 3 | 100 |
| Example 49 | (C19) | 57 | 7 | 100 |
| Example 50 | (C20) | 57 | 6 | 100 |
| Example 51 | (C21) | 57 | 6 | 100 |
| Example 52 | (C22) | 57 | 0 | 100 |
| Example 53 | (C23) | 57 | 3 | 150 |
| Example 54 | (C24) | 57 | 2 | 150 |
| Example 55 | (C25) | 57 | 1 | 100 |
| Example 56 | (C26) | 57 | 1 | 100 |
| Example 57 | (C27) | 57 | 12 | 500 |
| Example 58 | (C28) | 50 | 13 | 600 |
| Example 59 | (C29) | 50 | 35 | 1000 |
| Example 60 | (C30) | 73 | 12 | 500 |
| Comparative Example 2 | (C31) | 73 | Improper for deveplopping | — |

<Manufacture of Solid-State Imaging Device>

<<Manufacture of Color Filter for Solid-State Imaging Device>>

On the wafer manufactured in Example 32, having the green (G) colored pattern formed thereon, 1.2 μm×1.2 μm red (R) colored patterns were formed using the colored photo-sensitive composition (C26) for forming red (R) pattern. Again in the same way, 1.2 μm×1.2 μm blue (B) colored patterns were formed using the colored photo-sensitive composition (C25) for forming blue (B) pattern, to thereby manufacture a color filter for solid-state imaging device.

<<Evaluation of Color Filter for Solid-State Imaging Device>>

It was confirmed that the solid-state imaging devices, assembled by incorporating the color filters for solid-state imaging device, showed a good light shielding effect of the black matrix, a high resolution, and a good color separability.

What is claimed is:

1. A colored photo-sensitive composition comprising:
   (A) a resin which is increased, by action of an acid, in solubility into an alkali developing solution;
   (B) a pigment;
   (C) a compound which produces an acid upon irradiation by active light or radial ray; and
   (D) a solvent,
   wherein the colored photo-sensitive composition has a ratio of content of the (B) pigment of 20% by mass or more, relative to the total solids of the colored photo-sensitive composition,
   wherein the (A) resin which is increased, by action of an acid, in solubility into an alkali developing solution further has an acid group, wherein the acid group is a carboxylic acid group; and
   the (A) resin which is increased, by action of an acid, in solubility into an alkali developing solution still further has, in a side chain, an oligomer or polymer chain having a weight-average molecular weight of 500 to 100,000.

2. The colored photo-sensitive composition of claim 1, wherein the ratio of content of the (B) pigment is 60% by mass or more, relative to the total solids of the colored photo-sensitive composition.

3. The colored photo-sensitive composition of claim 2, wherein the (A) resin which is increased, by action of an acid, in solubility into an alkali developing solution has a group represented by the formula (A-I) below:

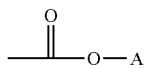

Formula (A-I)

wherein the formula (A-I), A represents a group eliminable by action of an acid.

4. The colored photo-sensitive composition of claim 1, wherein the (A) resin which is increased, by action of an acid, in solubility into an alkali developing solution has a group represented by the formula (A-I) below:

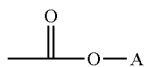

Formula (A-I)

wherein the formula (A-I), A represents a group eliminable by action of an acid.

5. The colored photo-sensitive composition of claim 4, wherein the (A) resin which is increased, by action of an acid, in solubility into an alkali developing solution further has, in a side chain, an oligomer or polymer chain having a weight-average molecular weight of 500 to 100,000, and the oligomer or polymer chain having a weight-average molecular weight of 500 to 100,000 has a group represented by the formula (A-I).

6. A cured film obtainable by curing the colored photo-sensitive composition according to claim 1.

7. A color filter having a colored layer using the colored photo-sensitive composition according to claim 1.

8. The color filter of claim 7, wherein the colored layer has a thickness of 0.2 to 3.0 μm.

9. A method for manufacturing a color filter, the method comprising:
coating a support using the colored photosensitive composition according to claim 1 to form a colored layer;
exposing pattern-wise the colored layer through a mask; and
forming a colored pattern by developing the exposed colored layer.

10. A device comprising the color filter according to claim 9, wherein the device is a liquid crystal display device or solid-state imaging device.

11. The colored photo-sensitive composition according to claim 1, wherein the (A) resin has a weight-average molecular weight of 10,000 to 50,000.

12. The colored photo-sensitive composition according to claim 1, wherein the (A) resin has a group which decomposes, by action of an acid, to produce an alkali-soluble group, wherein the alkali-soluble group is a carboxylic acid group.

13. A colored photo-sensitive composition comprising:
(A) a resin which is increased, by action of an acid, in solubility into an alkali developing solution;
(B) a pigment;
(C) a compound which produces an acid upon irradiation by active light or radial ray; and
(D) a solvent,
wherein the colored photo-sensitive composition has a ratio of content of the (B) pigment of 20% by mass or more, relative to the total solids of the colored photo-sensitive composition,
wherein the (A) resin which is increased, by action of an acid, in solubility into an alkali developing solution further has, in a side chain, an oligomer or polymer chain having a weight-average molecular weight of 500 to 100,000.

14. The colored photo-sensitive composition of claim 13, wherein the (A) resin which is increased, by action of an acid, in solubility into an alkali developing solution further has an acid group.

15. The colored photo-sensitive composition according to claim 13, wherein the (A) resin has a weight-average molecular weight of 10,000 to 50,000.

16. The colored photo-sensitive composition according to claim 13, wherein the oligomer or polymer chain having a weight-average molecular weight of 500 to 100,000 contains an acid-decomposable group.

* * * * *